US011640968B2

(12) United States Patent
Koduri

(10) Patent No.: US 11,640,968 B2
(45) Date of Patent: May 2, 2023

(54) INDUCTOR ON MICROELECTRONIC DIE

(71) Applicant: Texas Instruments Incorporated, Dallas, TX (US)

(72) Inventor: Sreenivasan K Koduri, Allen, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/182,111

(22) Filed: Nov. 6, 2018

(65) Prior Publication Data

US 2020/0144358 A1 May 7, 2020

(51) Int. Cl.
*H01L 49/02* (2006.01)
*H01L 23/00* (2006.01)

(52) U.S. Cl.
CPC ............ *H01L 28/10* (2013.01); *H01L 24/13* (2013.01); *H01L 2924/19042* (2013.01); *H01L 2924/19104* (2013.01)

(58) Field of Classification Search
CPC ......... H01L 24/10; H01L 24/11; H01L 24/12; H01L 24/13; H01L 24/14; H01L 28/10; H01F 2017/0086
See application file for complete search history.

(56) References Cited

U.S. PATENT DOCUMENTS

| 6,008,102 A | * | 12/1999 | Alford | ............... | H01L 23/5227 257/531 |
| 6,013,571 A | | 1/2000 | Morrell | | |
| 6,031,445 A | * | 2/2000 | Marty | ................ | H01F 27/2804 257/E21.022 |

(Continued)

FOREIGN PATENT DOCUMENTS

| CN | 107622983 A | 1/2018 |
| CN | 108028229 A | 5/2018 |

(Continued)

OTHER PUBLICATIONS

International Search Report for PCT/US 2019/059644 dated Nov. 4, 2019, 3 pages.
Koduri, "Expanded Head Pillar for Bump Bonds", U.S. Appl. No. 16/030,371, filed Jul. 9, 2018.

(Continued)

*Primary Examiner* — Peter M Albrecht
(74) *Attorney, Agent, or Firm* — Frank D. Cimino

(57) ABSTRACT

A microelectronic device has bump bonds and an inductor on a die. The microelectronic device includes first lateral conductors extending along a terminal surface of the die, wherein at least some of the first lateral conductors contact at least some of terminals of the die. The microelectronic device also includes conductive columns on the first lateral conductors, extending perpendicularly from the terminal surface, and second lateral conductors on the conductive columns, opposite from the first lateral conductors, extending laterally in a plane parallel to the terminal surface. A first set of the first lateral conductors, the conductive columns, and the second lateral conductors provide the bump bonds of the microelectronic device. A second set of the first lateral conductors, the conductive columns, and the second lateral conductors are electrically coupled in series to form the inductor. Methods of forming the microelectronic device are also disclosed.

22 Claims, 22 Drawing Sheets

(56) References Cited

U.S. PATENT DOCUMENTS

| | | | |
|---|---|---|---|
| 6,921,715 B2* | 7/2005 | Shen | H01L 23/3157 257/738 |
| 7,229,908 B1 | 6/2007 | Drizlikh et al. | |
| 7,531,893 B2 | 5/2009 | Koduri | |
| 7,723,129 B2 | 5/2010 | Koduri | |
| 8,017,410 B2 | 9/2011 | Koduri | |
| 8,212,155 B1 | 7/2012 | Wright et al. | |
| 8,513,772 B2* | 8/2013 | Kuo | H01F 17/0033 257/531 |
| 9,368,564 B2 | 6/2016 | Zuo et al. | |
| 9,748,324 B2 | 8/2017 | Liao | |
| 10,008,316 B2 | 6/2018 | Fazelpour et al. | |
| 10,186,467 B2 | 1/2019 | Appelt et al. | |
| 10,629,361 B2* | 4/2020 | Pornin | H01L 23/645 |
| 10,886,244 B2 | 1/2021 | Mariottini et al. | |
| 2002/0058355 A1* | 5/2002 | Brennan | H01L 28/10 438/108 |
| 2003/0137385 A1* | 7/2003 | Ahn | H01F 17/0033 336/200 |
| 2004/0219712 A1 | 11/2004 | Shen | |
| 2005/0056945 A1* | 3/2005 | Lunde | H01L 25/0655 257/782 |
| 2009/0085704 A1 | 4/2009 | Theuss | |
| 2009/0186453 A1 | 7/2009 | Koduri | |
| 2009/0188104 A1* | 7/2009 | Ching | H01F 41/046 29/602.1 |
| 2009/0309687 A1 | 12/2009 | Aleksov et al. | |
| 2011/0042782 A1 | 2/2011 | Chao et al. | |
| 2013/0307117 A1 | 11/2013 | Koduri | |
| 2014/0001635 A1 | 1/2014 | Chen et al. | |
| 2014/0027880 A1* | 1/2014 | Duevel | H01L 28/10 257/531 |
| 2014/0104288 A1 | 4/2014 | Shenoy et al. | |
| 2014/0111273 A1 | 4/2014 | Jou et al. | |
| 2014/0217546 A1 | 8/2014 | Yen et al. | |
| 2015/0137342 A1 | 5/2015 | Sutardja | |
| 2015/0279545 A1 | 10/2015 | Fazelpour et al. | |
| 2015/0279920 A1 | 10/2015 | Zuo et al. | |
| 2015/0371772 A1* | 12/2015 | Jou | H01F 41/046 427/58 |
| 2016/0233153 A1 | 8/2016 | Kidwell, Jr. et al. | |
| 2016/0284789 A1 | 9/2016 | Zuo et al. | |
| 2017/0373032 A1* | 12/2017 | Oh | H01L 21/561 |
| 2018/0068784 A1 | 3/2018 | Martinez et al. | |
| 2018/0233484 A1* | 8/2018 | Lin | H01L 24/73 |

FOREIGN PATENT DOCUMENTS

| | | | |
|---|---|---|---|
| JP | 2008066672 A | | 3/2008 |
| KR | 20050101022 A | * | 10/2005 |

OTHER PUBLICATIONS

European Patent Office, Search Report App No. 19881713.2, dated Jan. 17, 2022, 2pgs.

China National Intellectual Property Administration, Office action with search report, dated Dec. 5, 2022, 8 pages.

* cited by examiner

INDUCTOR ON MICROELECTRONIC DIE

FIELD

This disclosure relates to the field of microelectronic devices. More particularly, this disclosure relates to inductors on microelectronic devices.

BACKGROUND

Microelectronic devices frequently include circuits with inductors, commonly in the range of 0.5 to 5 nanohenries (nH). Inductors having in this range tend to require several hundred square microns, or more, undesirably increasing size and cost of the microelectronic devices. Attaining desirable Q values in these inductors has been challenging.

SUMMARY

The present disclosure introduces a microelectronic device having a die, and bump bonds and an inductor, on the die. The die contains terminals extending to a terminal surface of the die. The microelectronic device includes first lateral conductors extending along the terminal surface, wherein at least a portion of the first lateral conductors are in contact with at least a portion of the terminals. The microelectronic device also includes conductive columns on the first lateral conductors, extending perpendicularly away from the terminal surface, and second lateral conductors on the conductive columns, opposite from the first lateral conductors, extending laterally in a plane parallel to the terminal surface. The second lateral conductors have die attach surfaces located opposite from the conductive columns. A first set of the first lateral conductors, the conductive columns, and the second lateral conductors provide the bump bonds of the microelectronic device. A second set of the first lateral conductors, the conductive columns, and the second lateral conductors are electrically coupled in series to form the inductor. Methods of forming the microelectronic device are also disclosed.

DETAILED DESCRIPTION

Figure 1:
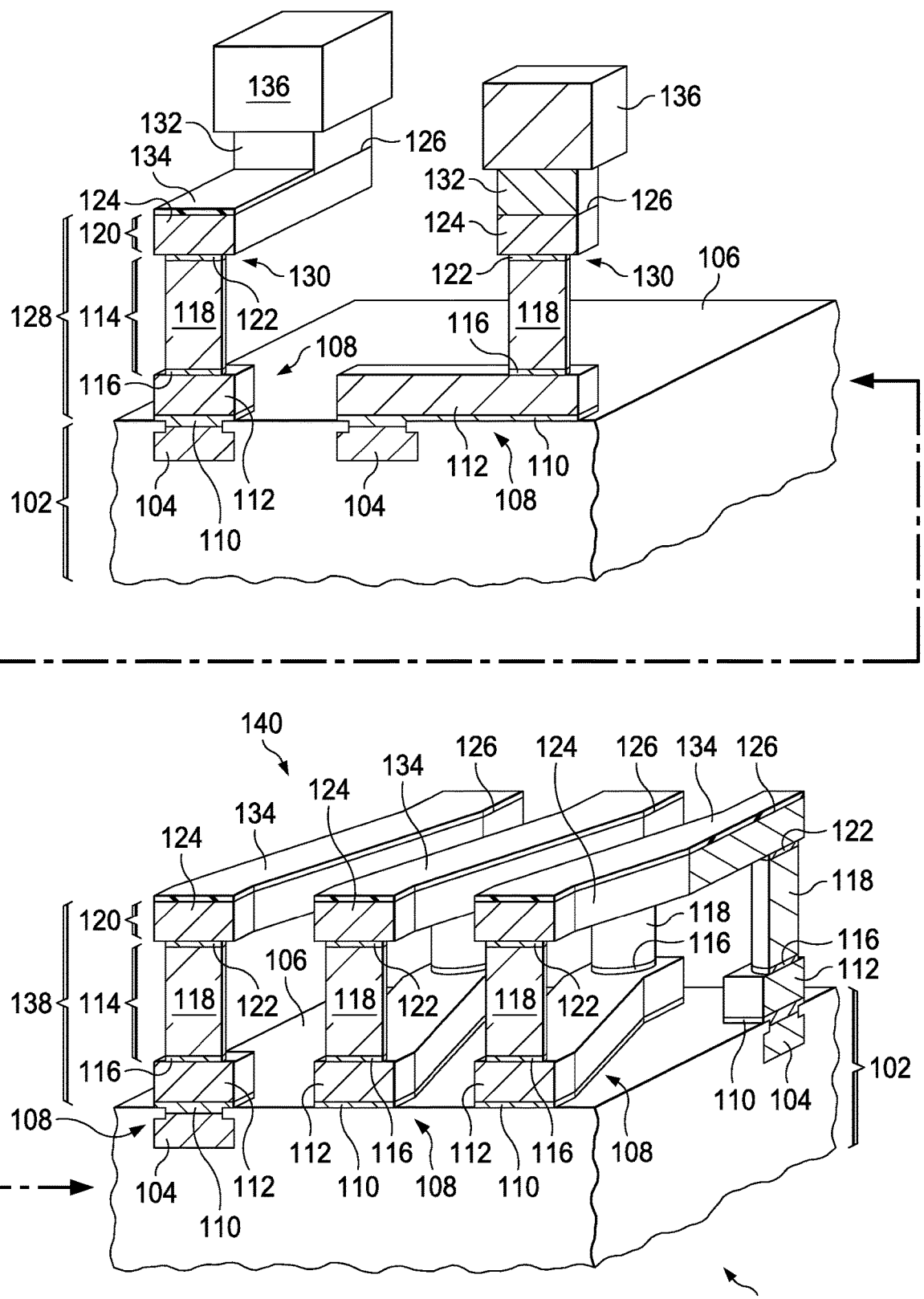
FIG. 1 is a cross section of an example microelectronic device having a die, and bump bonds and an inductor on the die.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure. In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to disclosed embodiments.

A microelectronic device includes a die, and has bump bonds and an inductor on the die. The die contains terminals, for example, bond pads, extending to a terminal surface of the die. The terminal surface is not necessarily planar. The microelectronic device includes first lateral conductors extending along the terminal surface, external to the die. At least a portion of the first lateral conductors are in contact with at least a portion of the terminals.

The microelectronic device includes conductive columns on the first lateral conductors, extending perpendicularly from the terminal surface. At least a portion of the conductive columns may contact the corresponding first lateral conductors at locations which are laterally displaced from the terminals to which the corresponding first lateral conductors are contacting. That is, at least a portion of the conductive columns are not located directly over the terminals to which they are electrically coupled through the corresponding first lateral conductors.

The microelectronic device includes second lateral conductors on the conductive columns, opposite from the first lateral conductors, extending laterally in a plane parallel to the terminal surface. The second lateral conductors have die attach surfaces located opposite from the conductive columns. Solder or electrically conductive adhesive may be disposed on the die attach surfaces of at least a portion of the second lateral conductors.

A first set of the first lateral conductors, the conductive columns, and the second lateral conductors provide the bump bonds of the microelectronic device. A second set of the first lateral conductors, the conductive columns, and the second lateral conductors are electrically coupled in series to form the inductor. The inductor may have a linear configuration, a toroidal configuration, or other configuration. One or more nodes of the inductor may contact terminals at the terminal surface. One or more nodes of the inductor may extend to the second lateral conductors for electrical connection to external leads of a package. The inductor may be a part of a transformer.

For the purposes of this disclosure, the term "lateral" is understood to refer to a direction parallel to a plane of the terminal surface of the die. It is noted that terms such as over and under may be used in this disclosure. These terms should not be construed as limiting the position or orientation of a structure or element, but should be used to provide spatial relationship between structures or elements. For the purposes of this disclosure, it will be understood that, if an element is referred to as being "connected" or "coupled" to another element, it may be directly connected or directly coupled to the other element, or intervening elements may be present.

FIG. 1 is a cross section of an example microelectronic device having a die, and bump bonds and an inductor on the die. The microelectronic device 100 includes the die 102, which may be manifested, for example, as a discrete semiconductor device, an integrated circuit, or a microelectrical mechanical system (MEMS) device. The die 102 has terminals 104 which extend to a terminal surface 106 of the die 102. The terminals 104 may include primarily aluminum or copper, for example. The terminals 104 may be manifested as bond pads, above a top interconnect level of the die 102, or may be portions of the top interconnect level. The terminals 104 may include an under bump metal (UBM) layer at the terminal surface 106. The UBM layer may include metals such as nickel, palladium, platinum, gold, copper, titanium, tungsten, chromium, or such. The die 102 may have a protective overcoat (PO) layer of electrically insulating material, not shown in FIG. 1, extending to the terminal surface 106 between the terminals 104. The PO layer may include silicon dioxide, silicon nitride, silicon oxynitride, polyimide, or such.

The microelectronic device 100 includes first lateral conductors 108 which extend along the terminal surface 106. At least a portion, and optionally all, of the first lateral conductors 108 contact at least a portion, and optionally all, of the terminals 104. Individual first lateral conductors 108 may contact one or more of the terminals 104. In this example, the first lateral conductors 108 are manifested with first conductor seed layers 110 on the terminal surface 106, and first main conductors 112 on the first conductor seed layers 110. The first main conductors 112 extend laterally to lateral boundaries of the first lateral conductors 108. The first main conductors 112 may extend in a straight line, or may have one or more lateral bends. The first conductor seed layers 110 may include adhesion layers containing metals such as titanium, tungsten, chromium, or nickel, on the terminal surface 106, and plating layers of copper on the adhesion layers. The first conductor seed layers 110 may have thicknesses of 10 nanometers to 1 micron, by way of example. The first main conductors 112 are electrically conductive and may include plated copper, optionally with other metals such as gold, silver, or nickel. The first main conductors 112 may have thicknesses of 3 microns to 30 microns, by way of example.

The microelectronic device 100 includes conductive columns 114 disposed on the first lateral conductors 108. The conductive columns 114 extend from the first lateral conductors 108, perpendicularly to the terminal surface 106. The term "perpendicularly" is understood to encompass orientations that are substantially perpendicular, within fabrication tolerances encountered when forming the microelectronic device 100. The term "perpendicularly" is further understood to encompass orientations that are substantially perpendicular, within measurement tolerances encountered when measuring the microelectronic device 100. A portion of the conductive columns 114 may contact the corresponding first lateral conductors 108 at locations which are laterally displaced from the terminals 104 to which the corresponding first lateral conductors 108 are contacting.

Another portion of the conductive columns 114 may contact the corresponding first lateral conductors 108 directly over the terminals 104 to which the corresponding first lateral conductors 108 are contacting. Instances of both portions of the conductive columns 114 are depicted in FIG. 1. In this example, the conductive columns 114 are manifested with column seed layers 116 on the first lateral conductors 108 and main columns 118 on the column seed layers 116. The main columns 118 are electrically conductive and extend to tops of the conductive columns 114, opposite from the first lateral conductors 108. The column seed layers 116 may include adhesion layers containing metals such as titanium, chromium, or nickel, on the terminal surface 106, and plating layers of copper on the adhesion layers. The column seed layers 116 may have thicknesses of 10 nanometers to 1 micron, by way of example. The main columns 118 may include plated copper, optionally with other metals such as gold, silver, or nickel, and may have compositions similar to the first main conductors 112. The main columns 118 may have heights, measured perpendicular to the terminal surface 106, of 30 microns to 100 microns, by way of example. The conductive columns 114 may have a variety of cross-sectional shapes. Some instances of the conductive columns 114 may have circular cross-sectional shapes, or square cross-sectional shapes with rounded corners. Other instances of the conductive columns 114 may have oval or rectangular cross-sectional shapes. Other cross-sectional shapes for the conductive columns 114 are within the scope of this example. The main columns 118 may have widths, measured parallel to the terminal surface 106, of 25 microns to 50 microns, and may have lengths, also measured parallel to the terminal surface 106, of 25 microns to 300 microns, by way of example.

The microelectronic device 100 further includes second lateral conductors 120 disposed on the conductive columns 114. The second lateral conductors 120 and the first lateral conductors 108 are located at opposite ends of the conductive columns 114. At least a portion of the second lateral conductors 120 extend laterally past the corresponding conductive columns 114 on which they are disposed, in a plane parallel to the terminal surface. In this example, the second lateral conductors 120 are manifested with second conductor seed layers 122 on the conductive columns 114, and second main conductors 124 on the second conductor seed layers 122. The second main conductors 124 extend laterally to lateral boundaries of the second lateral conductors 120. The second main conductors 124 may extend in a straight line, or may have one or more lateral bends. The second conductor seed layers 122 may include adhesion layers containing metals such as titanium, chromium or nickel, on the conductive columns 114, and plating layers of copper on the adhesion layers. The second conductor seed layers 122 may have thicknesses of 10 nanometers to 1 micron, by way of example. The second main conductors 124 may include plated copper, optionally with other metals such as gold, silver, or nickel, and may have compositions similar to the first main conductors 112. The second main conductors 124 may have thicknesses of 3 microns to 30 microns, by way of example. The second lateral conductors 120 have die attach surfaces 126 located opposite from the first lateral conductors 108.

A first set 128 of the first lateral conductors 108, the conductive columns 114, and the second lateral conductors 120 provide the bump bonds 130 of the microelectronic device 100. A die attach material 132 is disposed on the die attach surfaces 126 of the bump bonds 130. The die attach material 132 may include a solder, for example, in the form of solder paste, or a solder layer formed using a melted solder bath. Alternatively, the die attach material 132 may include an electrically conductive adhesive, such as epoxy with metal microparticles. Other compositions for the die attach material 132 are within the scope of this example. One or more of the bump bonds 130 may include an insulating layer 134 on the die attach surfaces 126, to define areas for the die attach material 132. The insulating layer 134 may include polymer insulating material such as polyimide or polyester, or may include inorganic insulating material such as ceramic or glass frits.

FIG. 1 depicts the microelectronic device 100 attached to external leads 136. The external leads 136 may be part of a package containing the microelectronic device 100, or may be part of a carrier or circuit board on which the microelectronic device 100 is mounted. The external leads 136 are electrically coupled to the bump bonds 130 through the die attach material 132. Having the first lateral conductors 108 and the second lateral conductors 120 in the bump bonds 130 may enable having a desired arrangement of the terminals 104 on the die 102 and connecting the terminals 104 to a desired arrangement of the external leads 136. Encapsulation material, such as epoxy, not shown in FIG. 1, may be disposed on the terminal surface 106, covering the first lateral conductors 108, and surrounding the conductive columns 114.

A second set 138 of the first lateral conductors 108, the conductive columns 114, and the second lateral conductors 120 are electrically configured in series to provide the inductor 140. The inductor 140 may have a linear configuration, as depicted in FIG. 1, in which the first lateral conductors 108, the conductive columns 114, and the second lateral conductors 120 of the inductor 140 are arranged in a linear array. Alternatively, the inductor 140 may have a toroidal configuration, or other configuration. The inductor 140 may have a desirably high quality factor, commonly referred to as the Q factor, due to low electrical resistance in the first lateral conductors 108, the conductive columns 114, and the second lateral conductors 120. Having the first lateral conductors 108 including copper with thicknesses of 3 microns to 30 microns may provide a Q factor greater than 1 at a frequency of 100 megahertz (MHz), which may be difficult to attain using a thinner redistribution layer (RDL) or interconnects in the die 102. The low electrical resistance of the inductor 140 may enable use in power circuits as well as signal circuits, which may degrade reliability in an inductor formed with a thinner RDL layer. The inductor 140 may include additional electrically conductive elements, in parallel to the first lateral conductors 108 or the second lateral conductors 120, to further improve the Q factor. For example, interconnects of the die 102 may be electrically coupled in parallel with the first lateral conductors 108 in the second set 138. Instances of the external leads 136 may be electrically coupled in parallel with the second lateral conductors 120 in the second set 138. One or more nodes of the inductor 140 may contact one or more of the terminals 104, as depicted in FIG. 1. One or more nodes of the inductor 140 may extend to the die attach surfaces 126 for electrical connection to external leads of a package. The inductor 140 may be a part of a transformer.

Figure 2A:
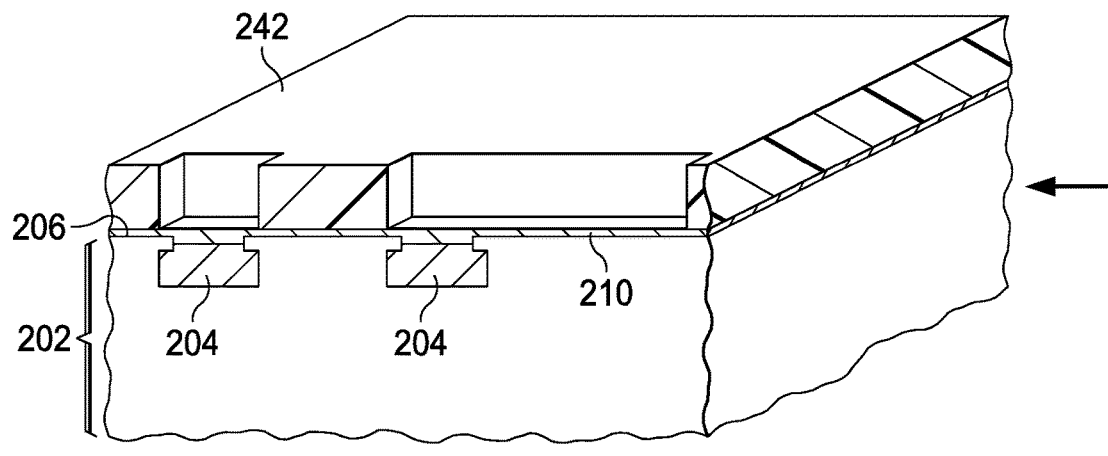
FIG. 2A through FIG. 2L are cross sections of a microelectronic device having a die, and bump bonds and an inductor on the die, depicted in stages of an example method of formation.
Figure 2A:
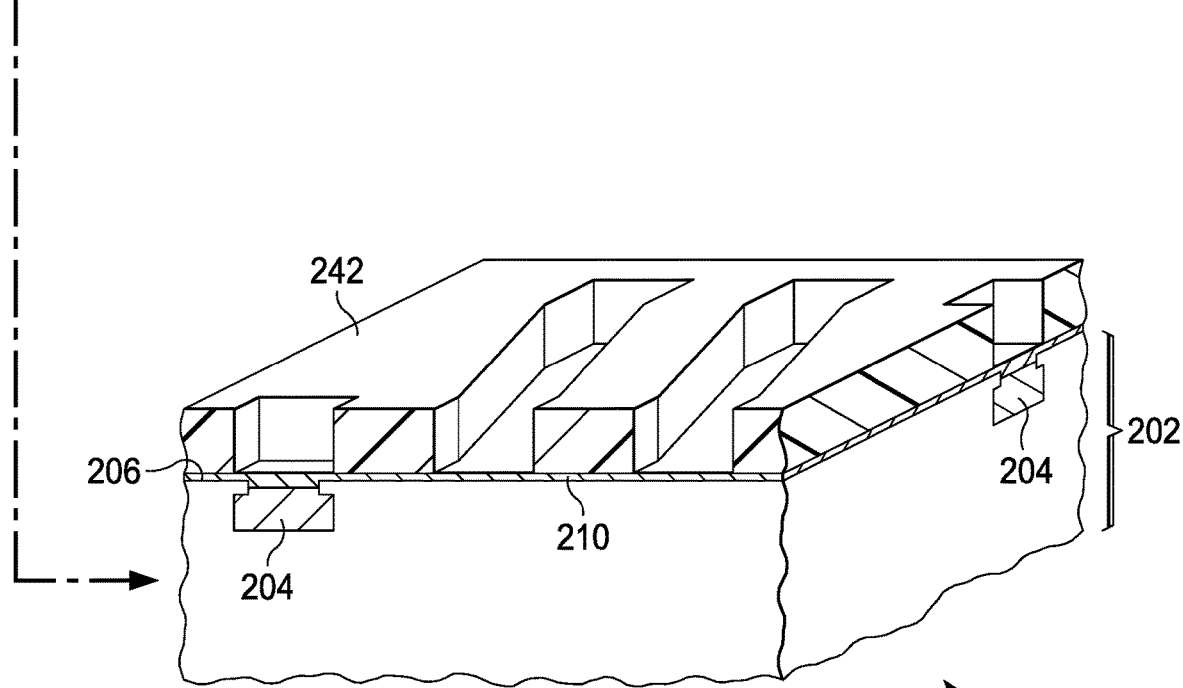

FIG. 2A through FIG. 2L are cross sections of a microelectronic device having a die, and bump bonds and an inductor on the die, depicted in stages of an example method of formation. Referring to FIG. 2A, the microelectronic device 200 includes the die 202, which may be implemented as a discrete semiconductor device, an integrated circuit, a MEMS device, or other such microelectronic die. The die 202 may be part of a semiconductor wafer containing additional die. The die 202 has terminals 204 which extend to a terminal surface 206 of the die 202. The terminals 204 may be formed of primarily aluminum or copper, for example, and may have a UBM layer formed at the terminal surface 206 to protect the terminals 204 during fabrication, and so provide a low electrical connection to the terminals 204. The UBM layer may be formed, for example, by a sputter process or an electroless plating process. The die 202 may have a PO layer extending to the terminal surface 206 between the terminals 204. The PO layer may include any of the electrically insulating materials disclosed in reference to the PO layer of FIG. 1, and may be formed, for example, by a plasma enhanced chemical vapor deposition (PECVD) process or a photolithographic process.

A first conductor seed layer 210 is formed on the terminal surface 206, contacting the terminals 204. The first conductor seed layer 210 may include an adhesion layer formed on the terminal surface 206, contacting the terminals 204, and a plating layer on the adhesion layer. The adhesion layer may include one or more metals having desired adhesion to the terminals 204 and to material of the die 202, such as the PO layer, at the terminal surface 206 adjacent to the terminals 204. For example, the adhesion layer may include titanium, titanium tungsten, chromium, or nickel, and may be formed by one or more sputter processes. The plating layer may include primarily copper, and may be formed by a sputter process.

A first conductor plating mask 242 is formed over the first conductor seed layer 210, exposing the first conductor seed layer 210 in areas for subsequently-formed first lateral conductors 208, shown in FIG. 2B. In one version of this example, the first conductor plating mask 242 may include photoresist, or other photosensitive polymer, and may be formed by a photolithographic process. In another version, the first conductor plating mask 242 may include polymer material, and may be formed by an additive process, such as a material jetting process. In a further version, the first conductor plating mask 242 may include thermally erodible material such as polyimide, polyester, or polymethylmethylacrylate (PMMA), and may be formed by a laser ablation process. Other materials for the first conductor plating mask 242 and methods for forming the first conductor plating mask 242 are within the scope of this example.

Figure 2B:
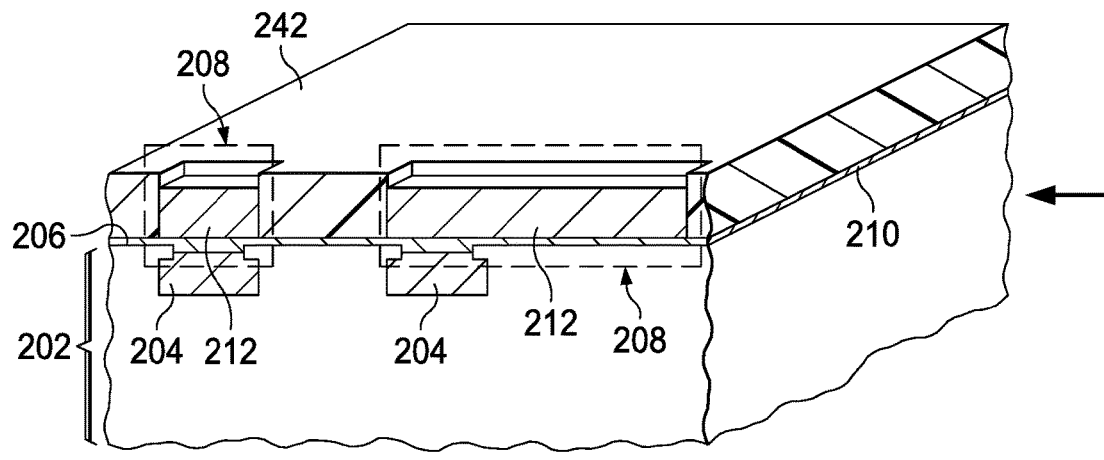
Figure 2B:
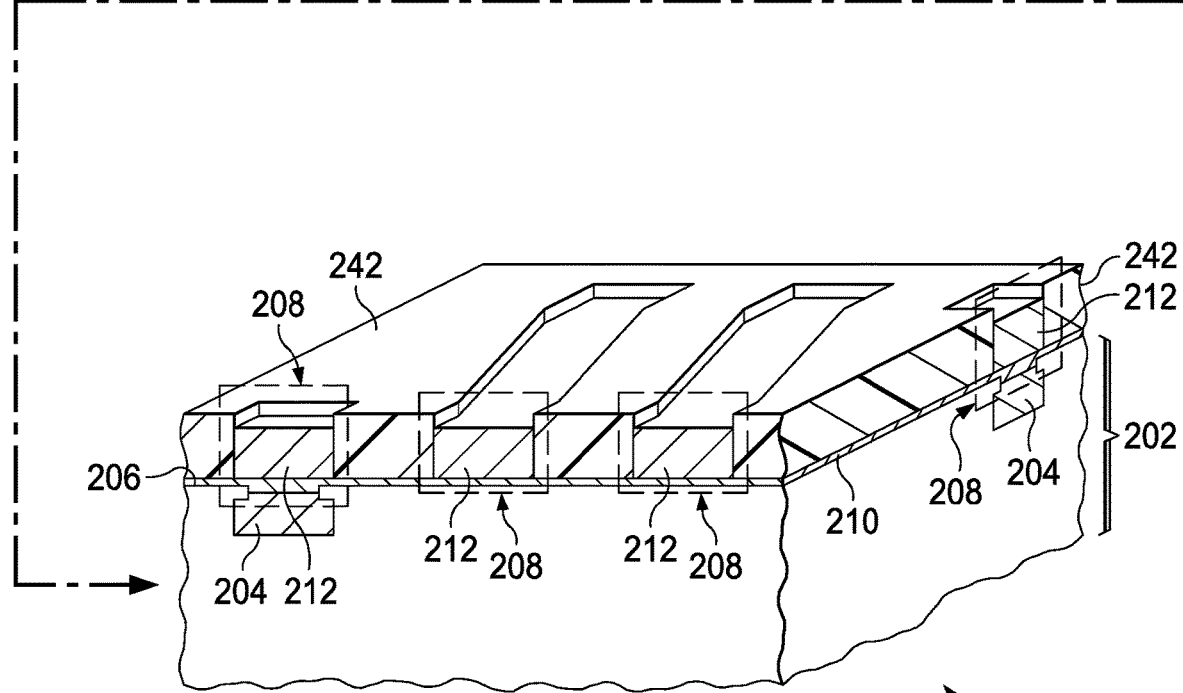

Referring to FIG. 2B, the first main conductors 212 are formed on the first conductor seed layer 210 where exposed by the first conductor plating mask 242. The first main conductors 212 may have the composition disclosed in reference to the first main conductors 112 of FIG. 1. The first main conductors 212 may be formed by a copper electroplating process, or optionally by a copper electroless plating operation. The first conductor seed layer 210 and the first main conductors 212 provide the first lateral conductors 208 of the microelectronic device 200.

Figure 2C:
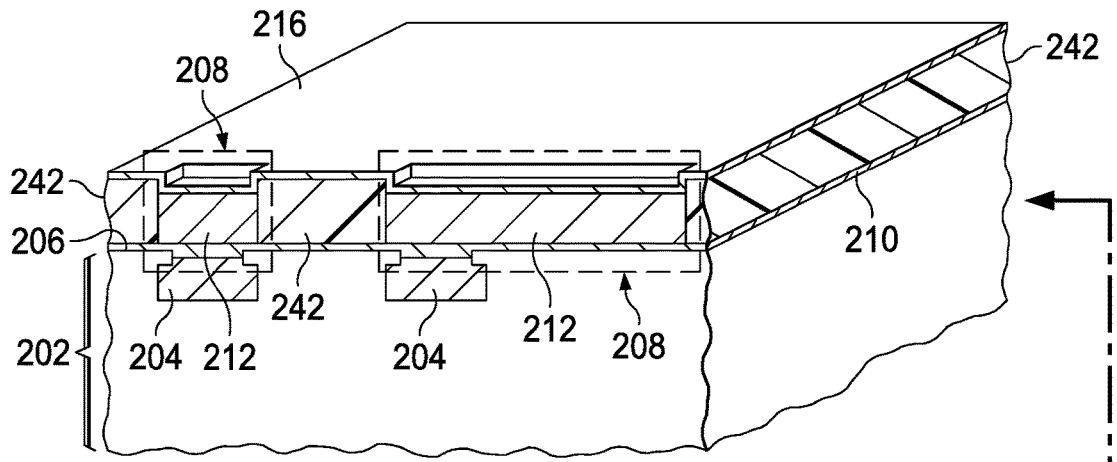
Figure 2C:
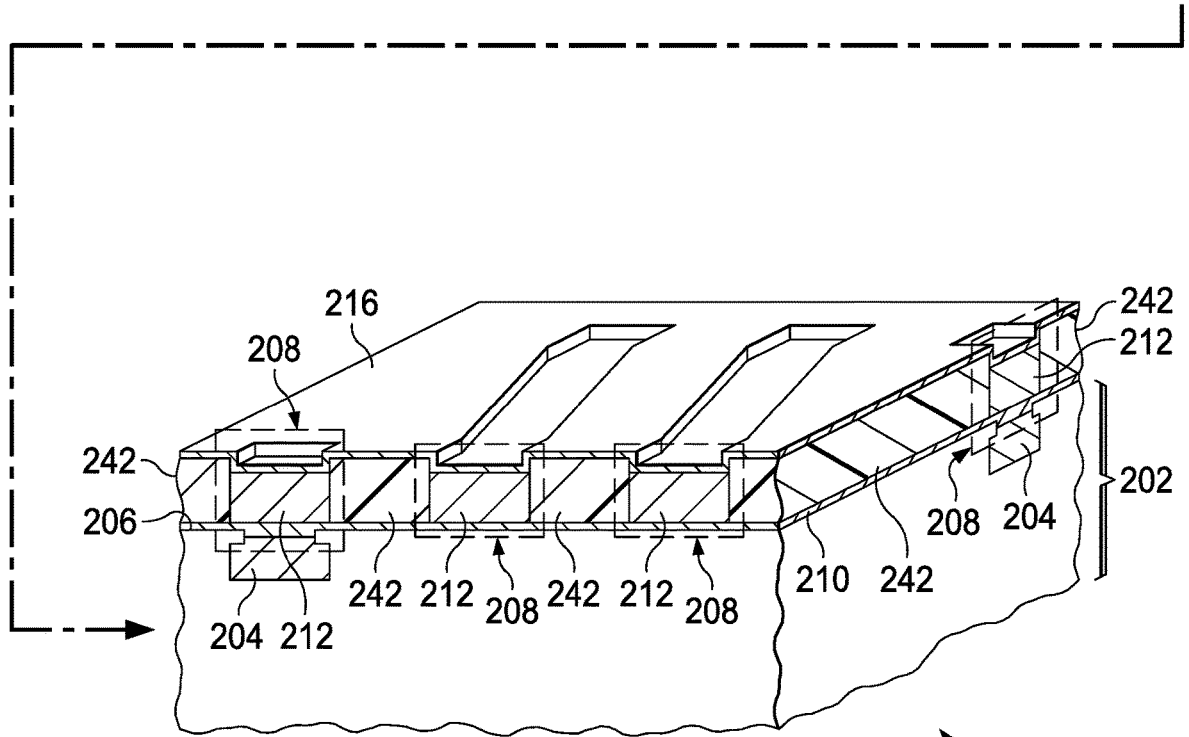

Referring to FIG. 2C, a column seed layer 216 is formed on the first lateral conductors 208 and over the first conductor plating mask 242. The column seed layer 216 may include an adhesion layer formed on the first lateral conductors 208 and over the first conductor plating mask 242, contacting the first lateral conductors 208, and a plating layer on the adhesion layer. The adhesion layer may include one or more metals having desired adhesion to metal in the first lateral conductors 208 and to material of the first conductor plating mask 242. For example, the adhesion layer may include titanium, chromium, or nickel, and may be formed by one or more sputter processes. The plating layer may include primarily copper, and may be formed by a sputter process.

Figure 2D:
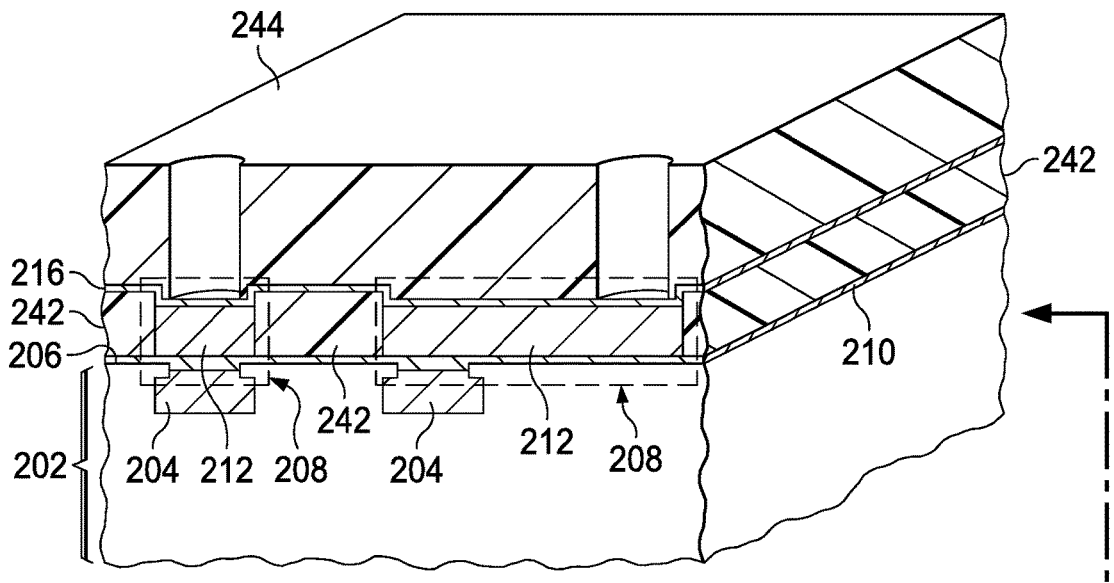
Figure 2D:
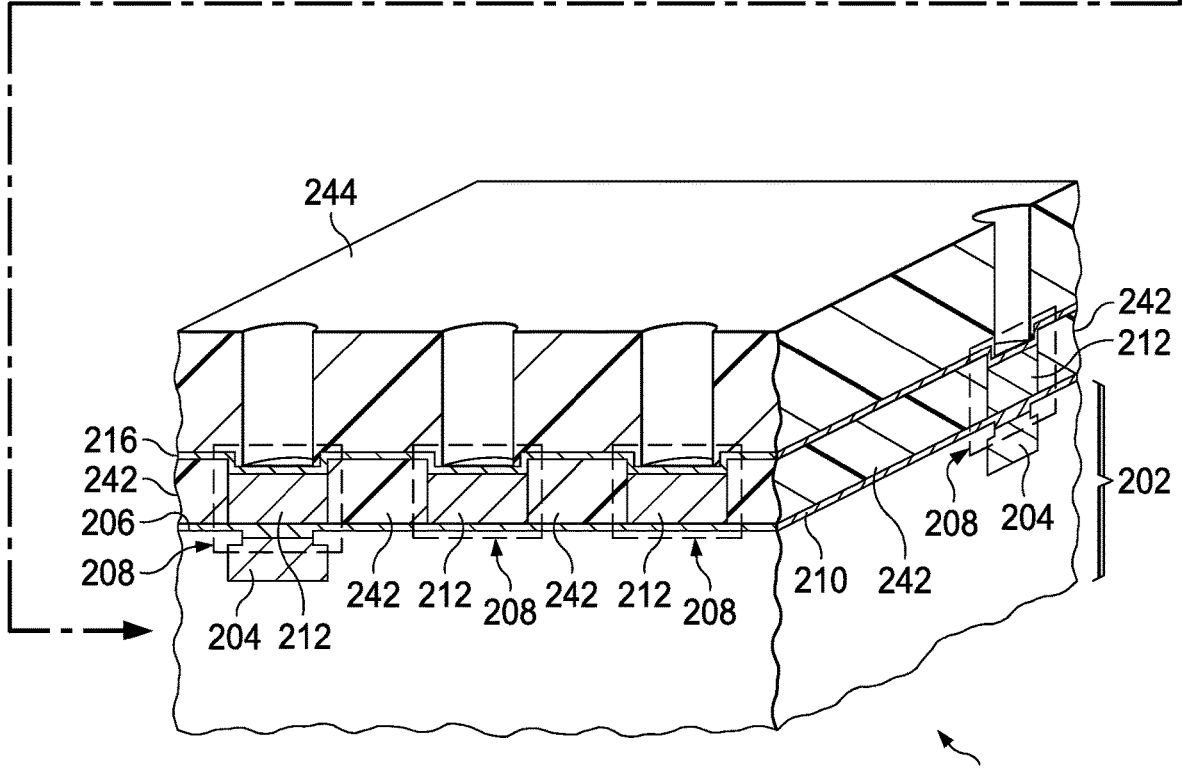

Referring to FIG. 2D, a column plating mask 244 is formed over the column seed layer 216, exposing the column seed layer 216 in areas for subsequently-formed conductive columns 214, shown in FIG. 2E. The column plating mask 244 may be formed by any of the methods disclosed in reference to the first conductor plating mask 242. Other materials for the column plating mask 244 and methods for forming the column plating mask 244 are within the scope of this example.

Figure 2E:
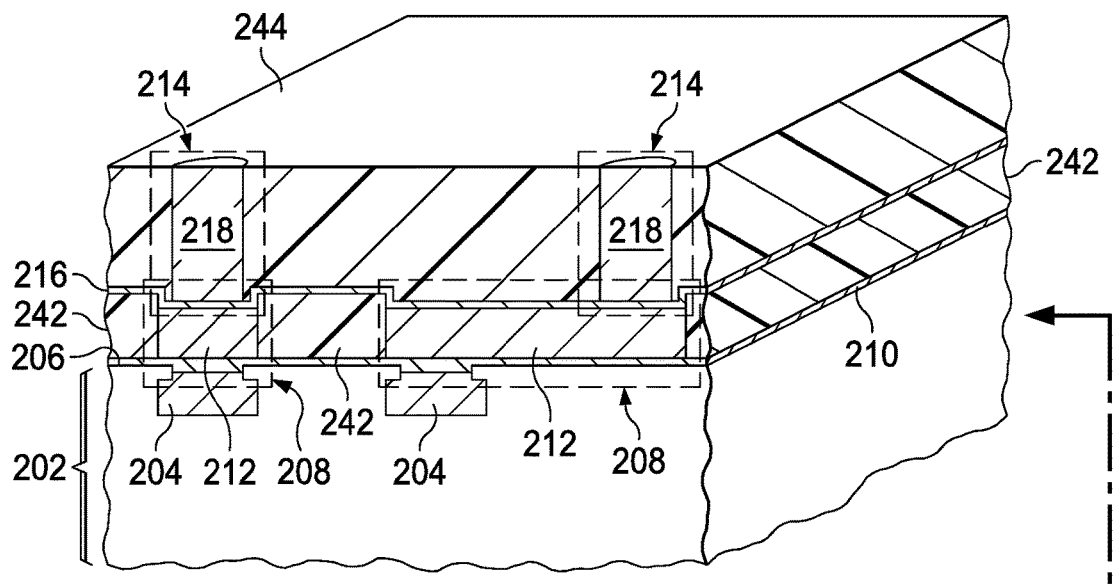
Figure 2E:
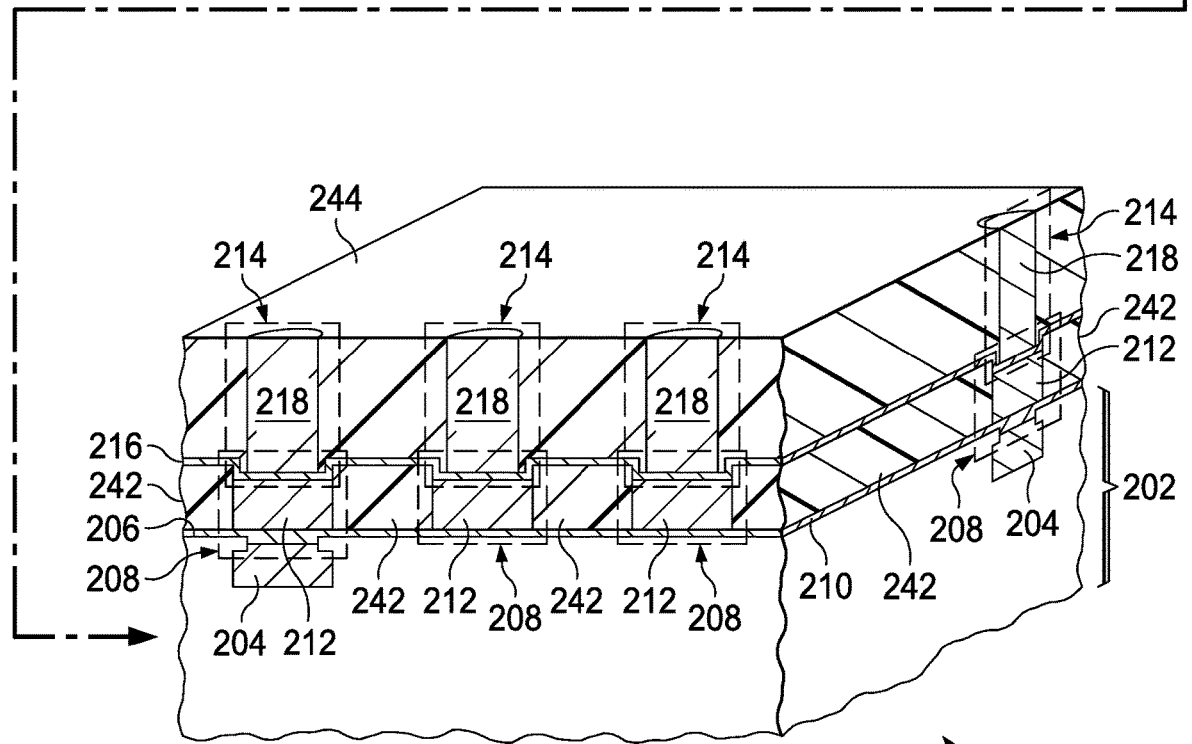

Referring to FIG. 2E, main columns 218 are formed on the column seed layer 216 where exposed by the column plating mask 244. The main columns 218 may have the composition disclosed in reference to the main columns 118 of FIG. 1. The main columns 218 may be formed by a copper electroplating process, or optionally by a copper electroless plating operation. The column seed layer 216 and the main columns 218 provide the conductive columns 214 of the microelectronic device 200.

Figure 2F:
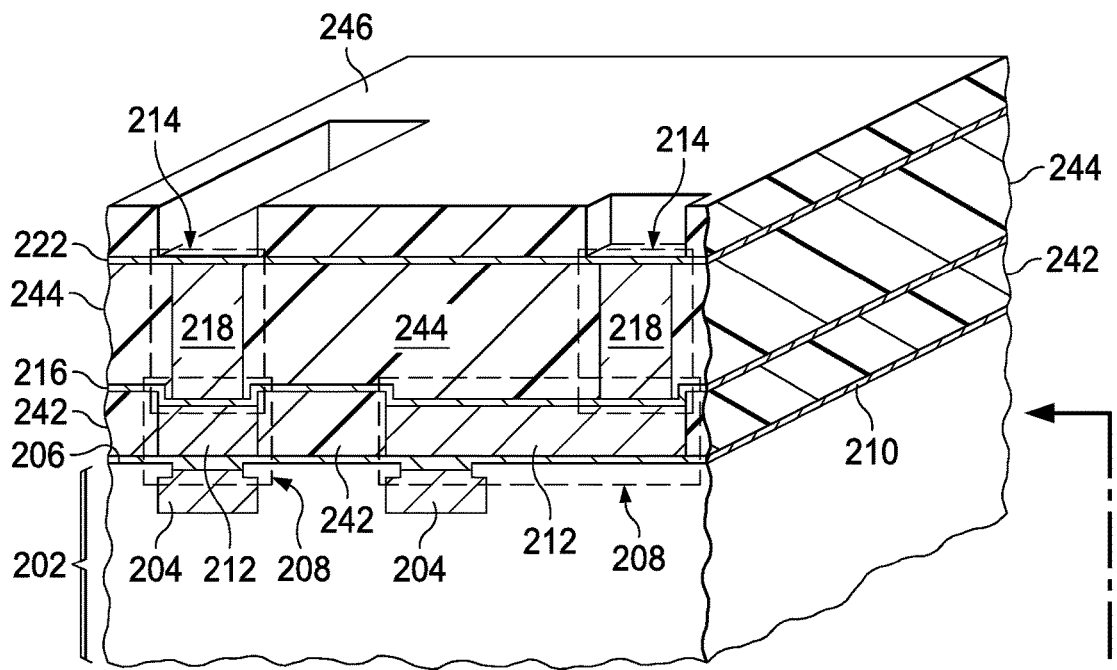
Figure 2F:
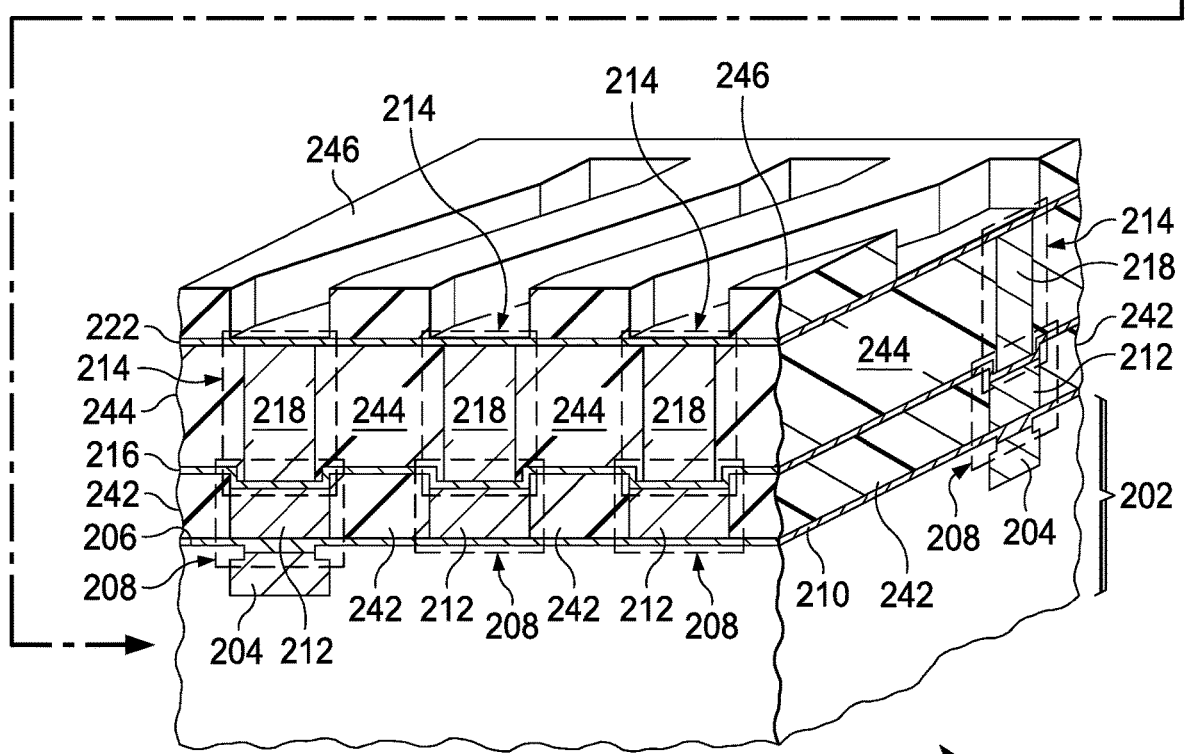

Referring to FIG. 2F, a second conductor seed layer 222 is formed on the conductive columns 214 and over the column plating mask 244. The second conductor seed layer 222 may include an adhesion layer formed on the conductive columns 214 and over the column plating mask 244, contacting the conductive columns 214, and a plating layer on the adhesion layer. The adhesion layer may include one or more metals having desired adhesion to metal in the conductive columns 214 and to material of the column plating mask 244. For example, the adhesion layer may include any of the metals disclosed in reference to the adhesion layer of the column seed layer 216, and may be formed by one or more sputter processes. The plating layer may include primarily copper, and may be formed by a sputter process.

A second conductor plating mask 246 is formed over the second conductor seed layer 222, exposing the second conductor seed layer 222 in areas for subsequently-formed second lateral conductors 220, shown in FIG. 2G. The second conductor plating mask 246 may be formed by any of the methods disclosed in reference to the first conductor plating mask 242. Other materials for the second conductor plating mask 246 and methods for forming the second conductor plating mask 246 are within the scope of this example.

Figure 2G:
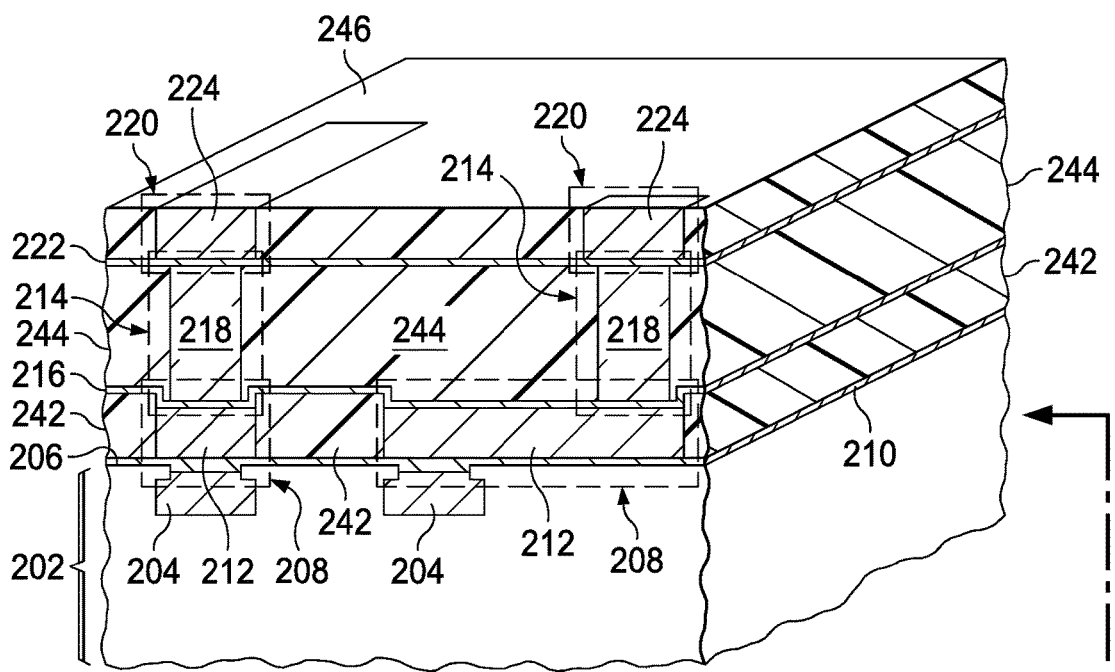
Figure 2G:
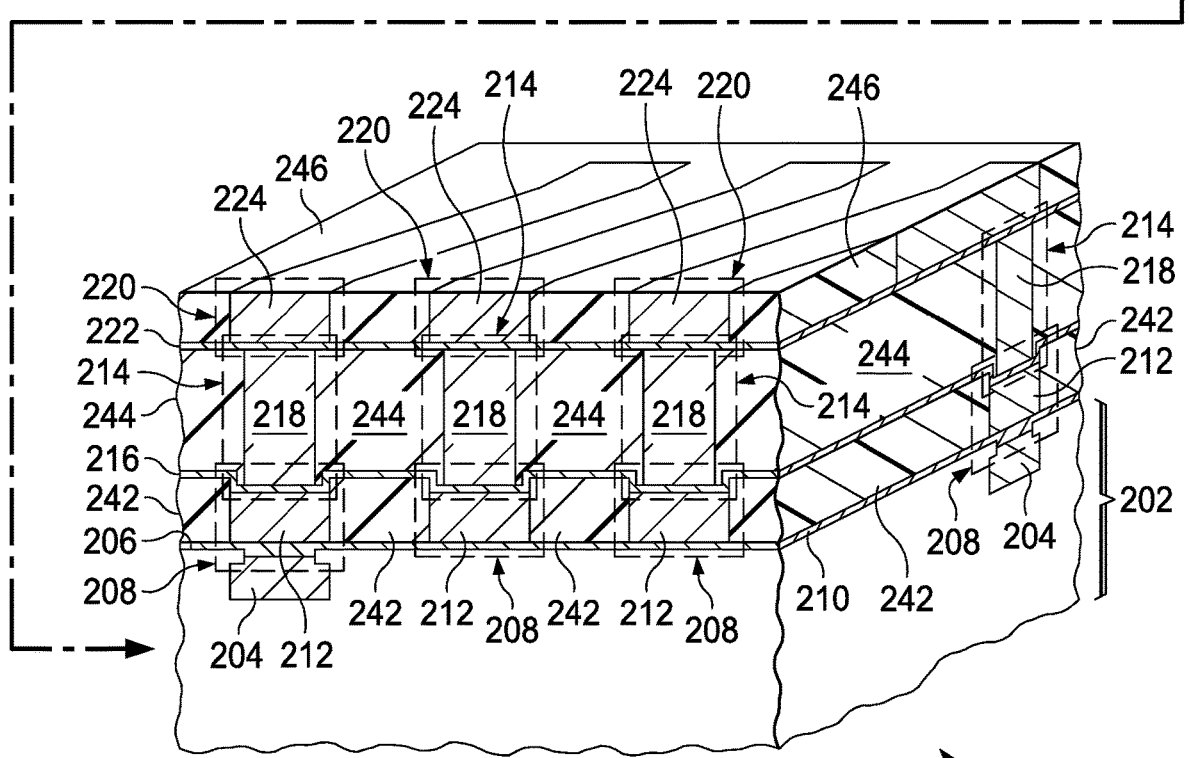

Referring to FIG. 2G, the second main conductors 224 are formed on the second conductor seed layer 222 where exposed by the second conductor plating mask 246. The second main conductors 224 may have the composition disclosed in reference to the second main conductors 124 of FIG. 1. The second main conductors 224 may be formed by a copper electroplating process, or optionally by a copper electroless plating operation. The second conductor seed layer 222 and the second main conductors 224 provide the second lateral conductors 220 of the microelectronic device 200.

Figure 2H:
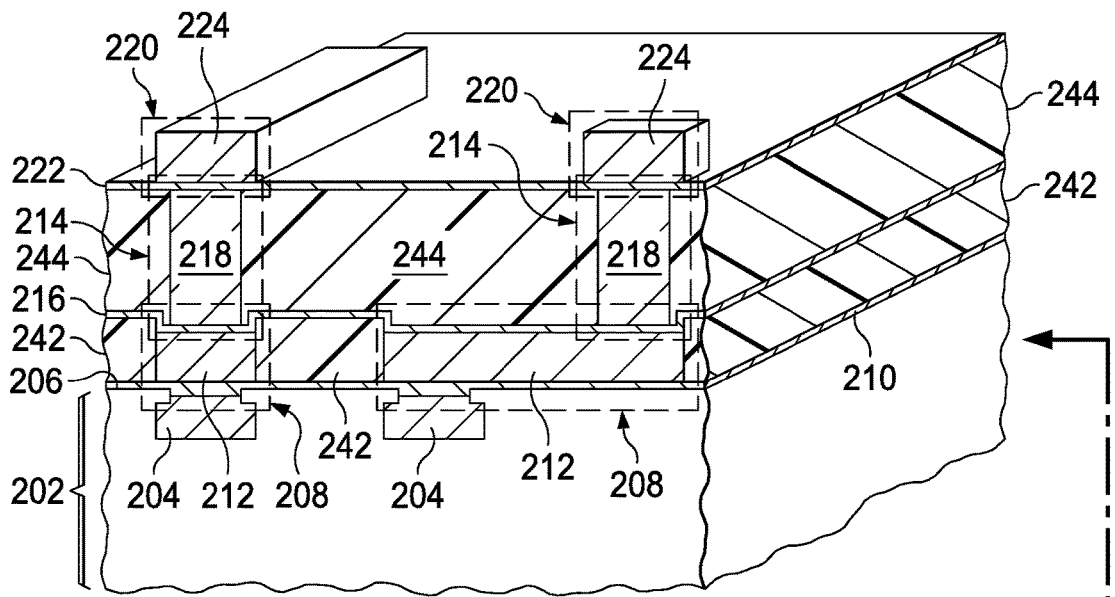
Figure 2H:
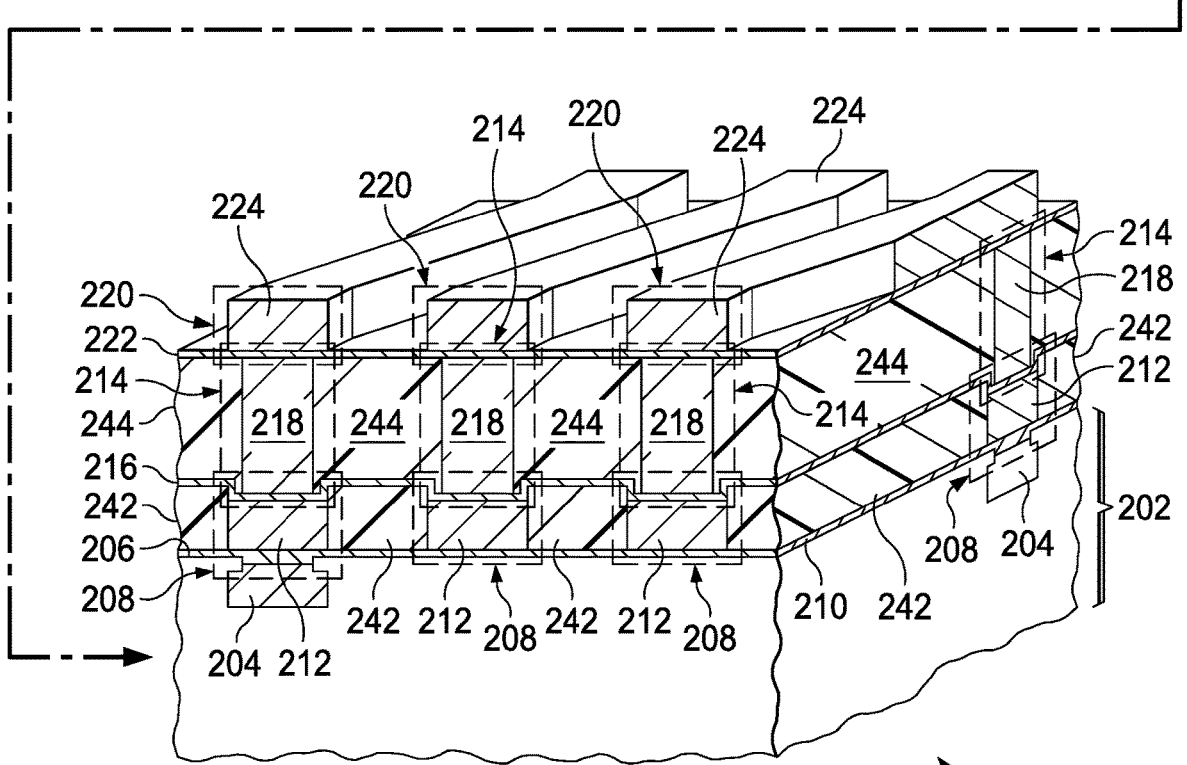

Referring to FIG. 2H, the second conductor plating mask 246 of FIG. 2G is removed, leaving the second lateral conductors 220 in place. The second conductor plating mask 246 may be removed by a dry process using oxygen radicals, such as an asher process or an ozone process. Alternatively, the second conductor plating mask 246 may be removed by a wet process using solvents such as n-methyl-2-pyrrolidine (NMP) or dimethyl sulfoxide (DMSO). Proprietary formulations of resist removal chemicals for removing the second conductor plating mask 246 are commercially available from several suppliers.

Figure 2I:
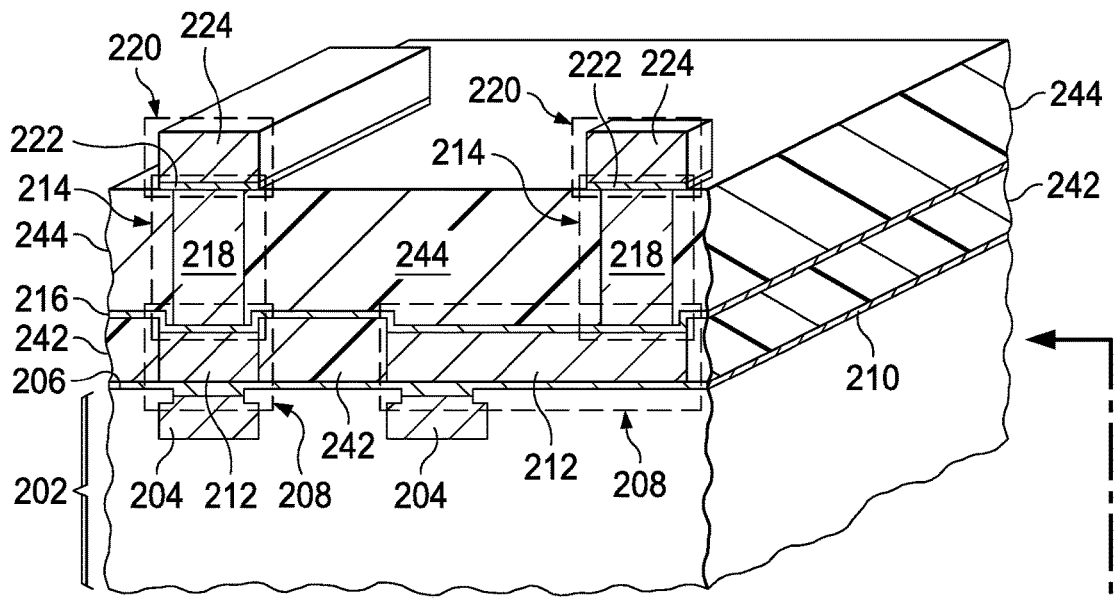
Figure 2I:
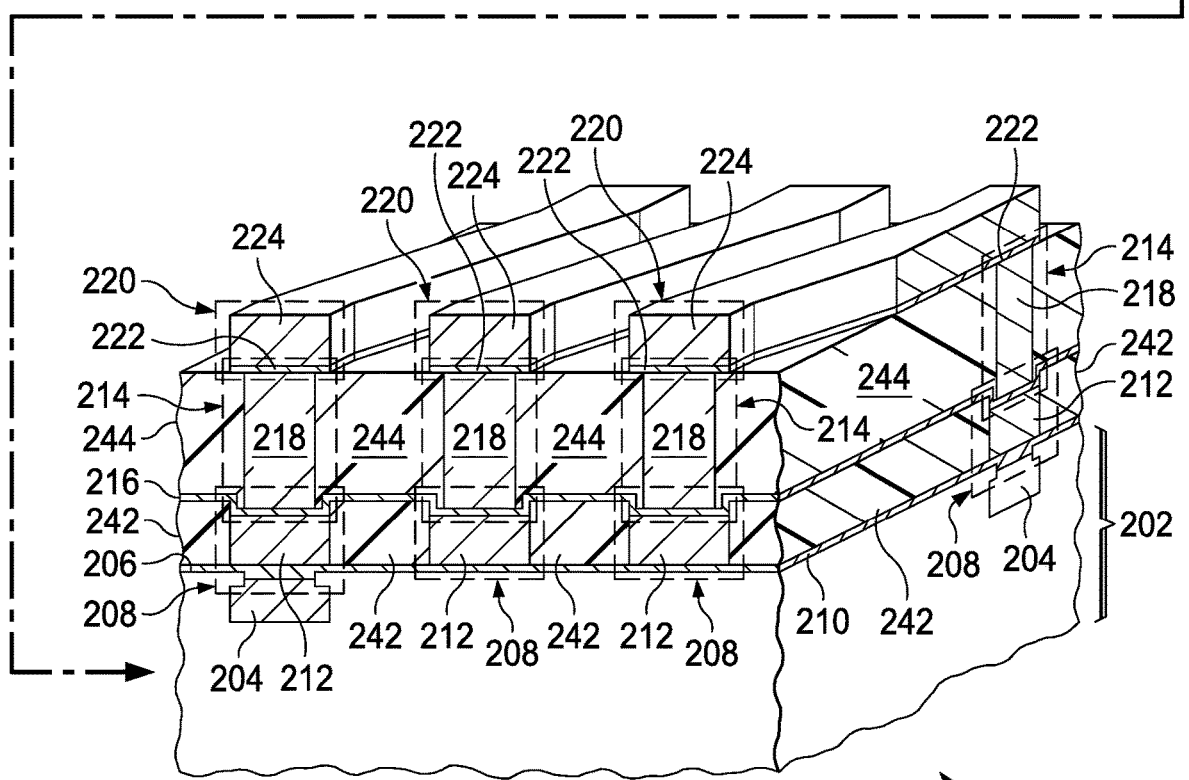

Referring to FIG. 2I, the second conductor seed layer 222 is removed where exposed by the second main conductors 224, leaving the second conductor seed layer 222 in place under the second main conductors 224. The second conductor seed layer 222 may be removed by a wet etch process using an acid bath. A small portion of the second main conductors 224 may be removed during removal of the second conductor seed layer 222.

Figure 2J:
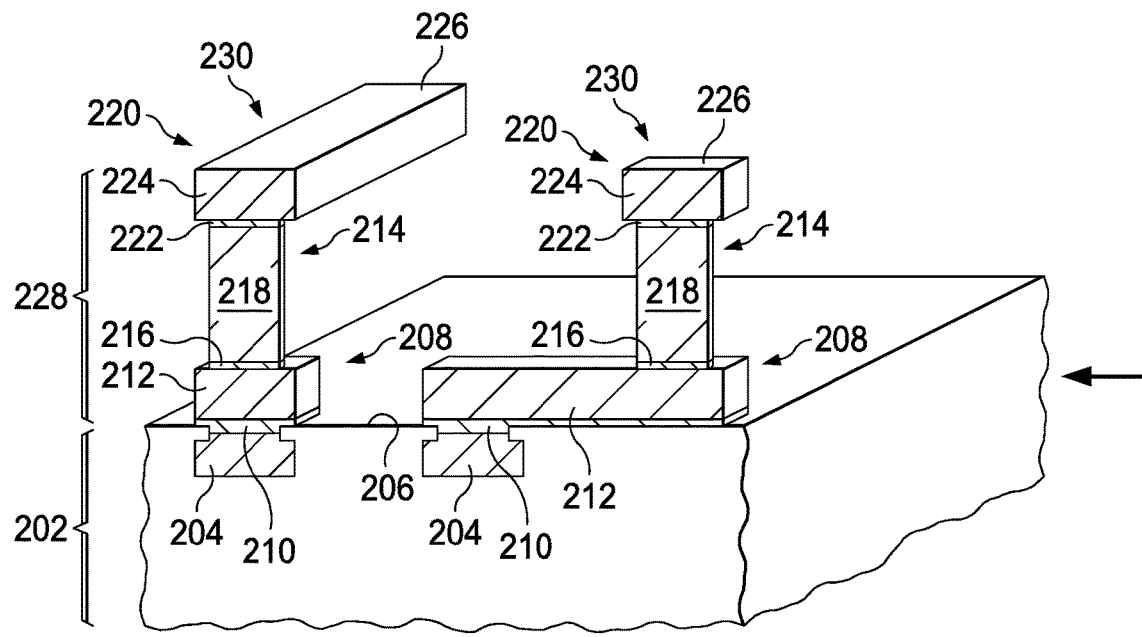
Figure 2J:
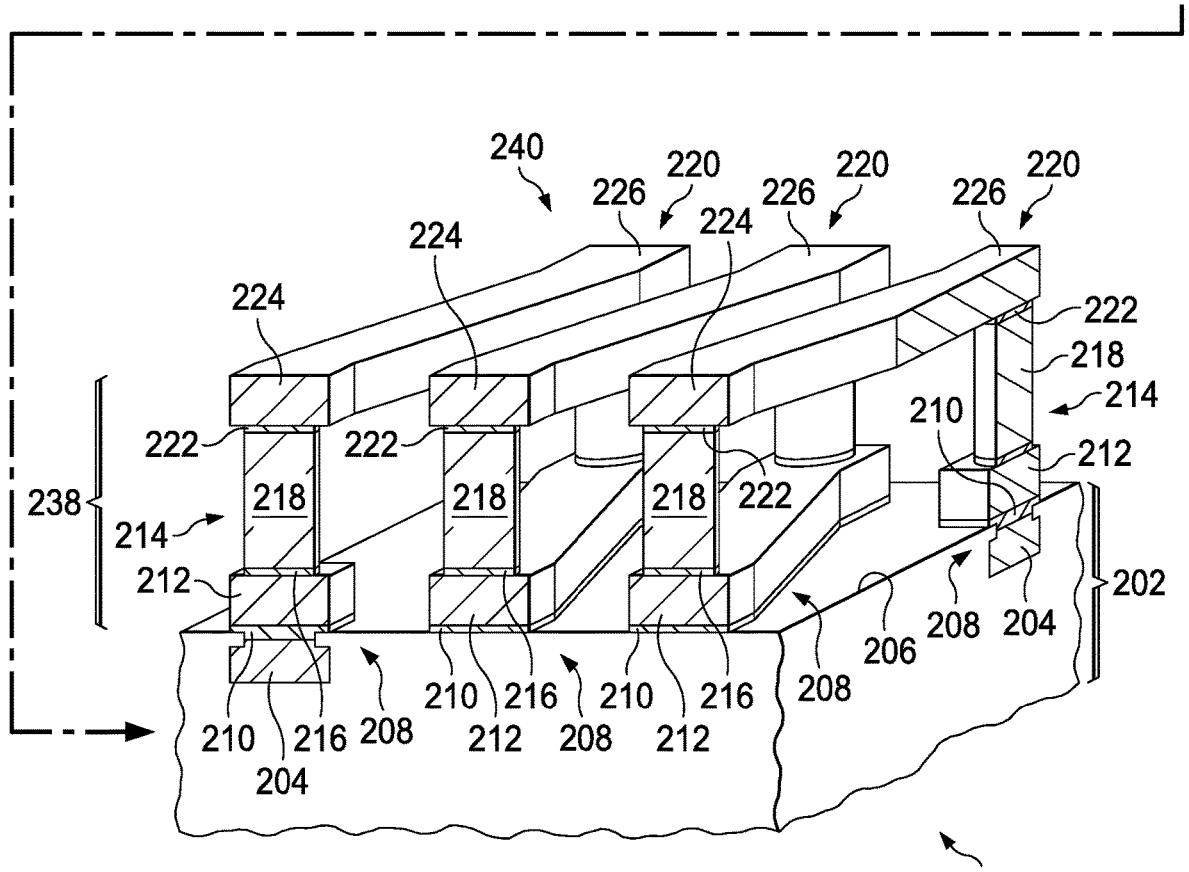

Referring to FIG. 2J, the column plating mask 244 of FIG. 2I is removed, leaving the main columns 218 in place. The column plating mask 244 may be removed by a process similar to the process used to remove the second conductor plating mask 246 of FIG. 2G. Other methods for removing the column plating mask 244 are within the scope of this example.

The column seed layer 216 is removed where exposed by the main columns 218. The column seed layer 216 may be removed by a process similar to the process used to remove the second conductor seed layer 222. Other methods to remove the column seed layer 216 are within the scope of this example. Removal of the column seed layer 216 may result in removal of the second conductor seed layer 222 on the second main conductors 224 where exposed by the main columns 218, as depicted in FIG. 2J.

Subsequently, the first conductor plating mask 242 is removed, leaving the first main conductors 212 in place. The first conductor plating mask 242 may be removed by a process similar to the process used to remove the second conductor plating mask 246. Other methods for removing the first conductor plating mask 242 are within the scope of this example.

The first conductor seed layer 210 is removed where exposed by the first main conductors 212, leaving the first conductor seed layer 210 in place between the first main conductors 212 and the terminal surface 206. The first conductor seed layer 210 may be removed by a process similar to the process used to remove the second conductor seed layer 222. Other methods to remove the first conductor seed layer 210 are within the scope of this example.

The second lateral conductors 220 have die attach surfaces 226 located opposite from the first lateral conductors 208. A first set 228 of the first lateral conductors 208, the conductive columns 214, and the second lateral conductors 220 provide the bump bonds 230 of the microelectronic device 200. A second set 238 of the first lateral conductors 208, the conductive columns 214, and the second lateral conductors 220 are electrically configured in series to provide the inductor 240. Forming the first lateral conductors 208, the conductive columns 214, and the second lateral conductors 220, of the first set 228 and the second set 238, concurrently, may advantageously reduce fabrication cost and complexity compared to forming the inductor 240 separately from the bump bonds 230.

Figure 2K:
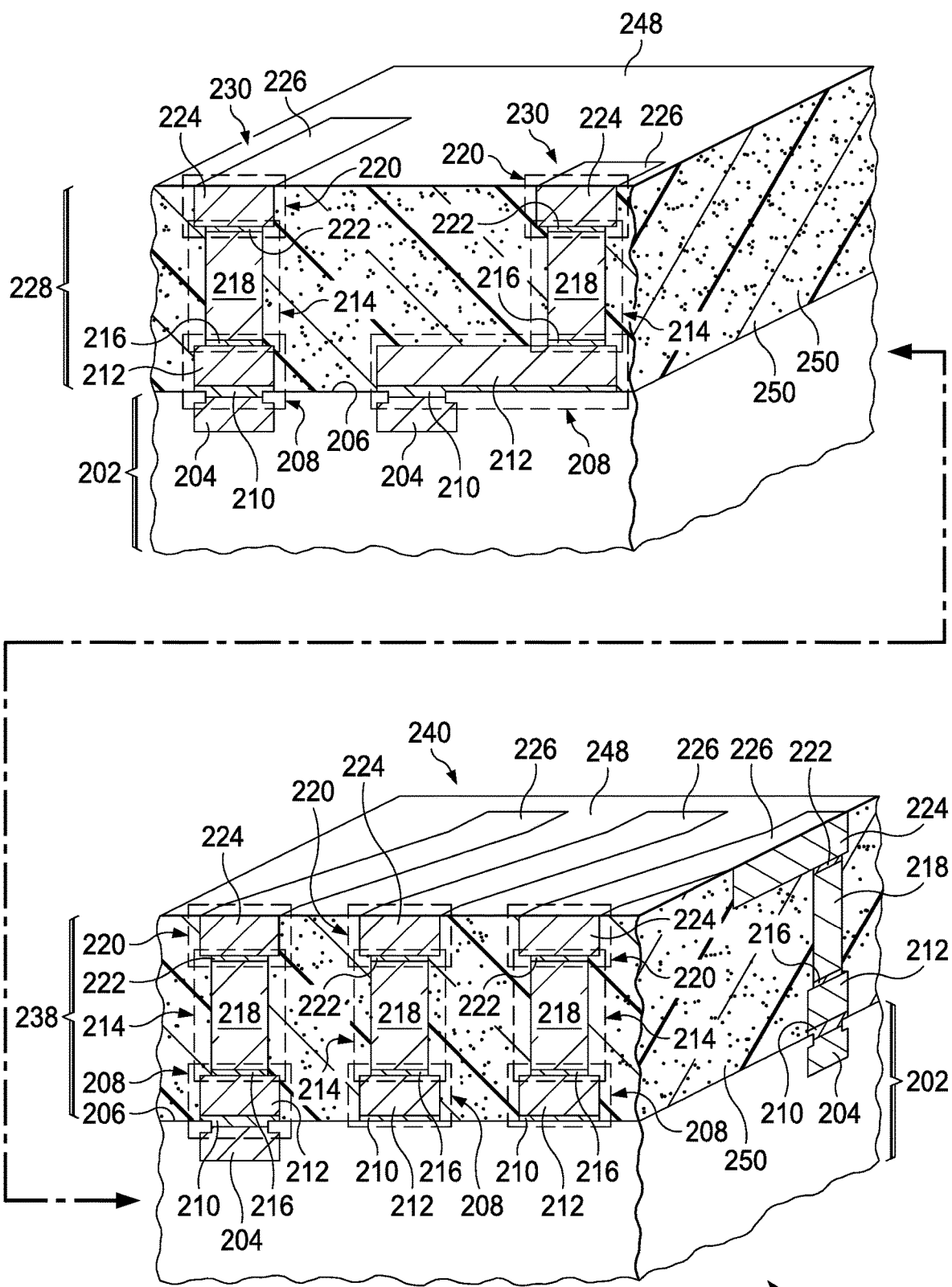

Referring to FIG. 2K, encapsulation material 248 may be formed on the die 202, surrounding the first lateral conductors 208 and the conductive columns 214, and extending to the second lateral conductors 220. The encapsulation material 248 may include epoxy, and may be formed by injection molding or press molding, by way of example. The encapsulation material 248 may include magnetic particles 250, such as ferrite particles or ferromagnetic particles containing iron, nickel, or cobalt. The magnetic particles 250 may provide an average relative magnetic permeability of the encapsulation material 248 greater than 1, wherein the relative magnetic permeability of a vacuum is 1, thereby advantageously increasing an inductance of the inductor 240.

Figure 2L:
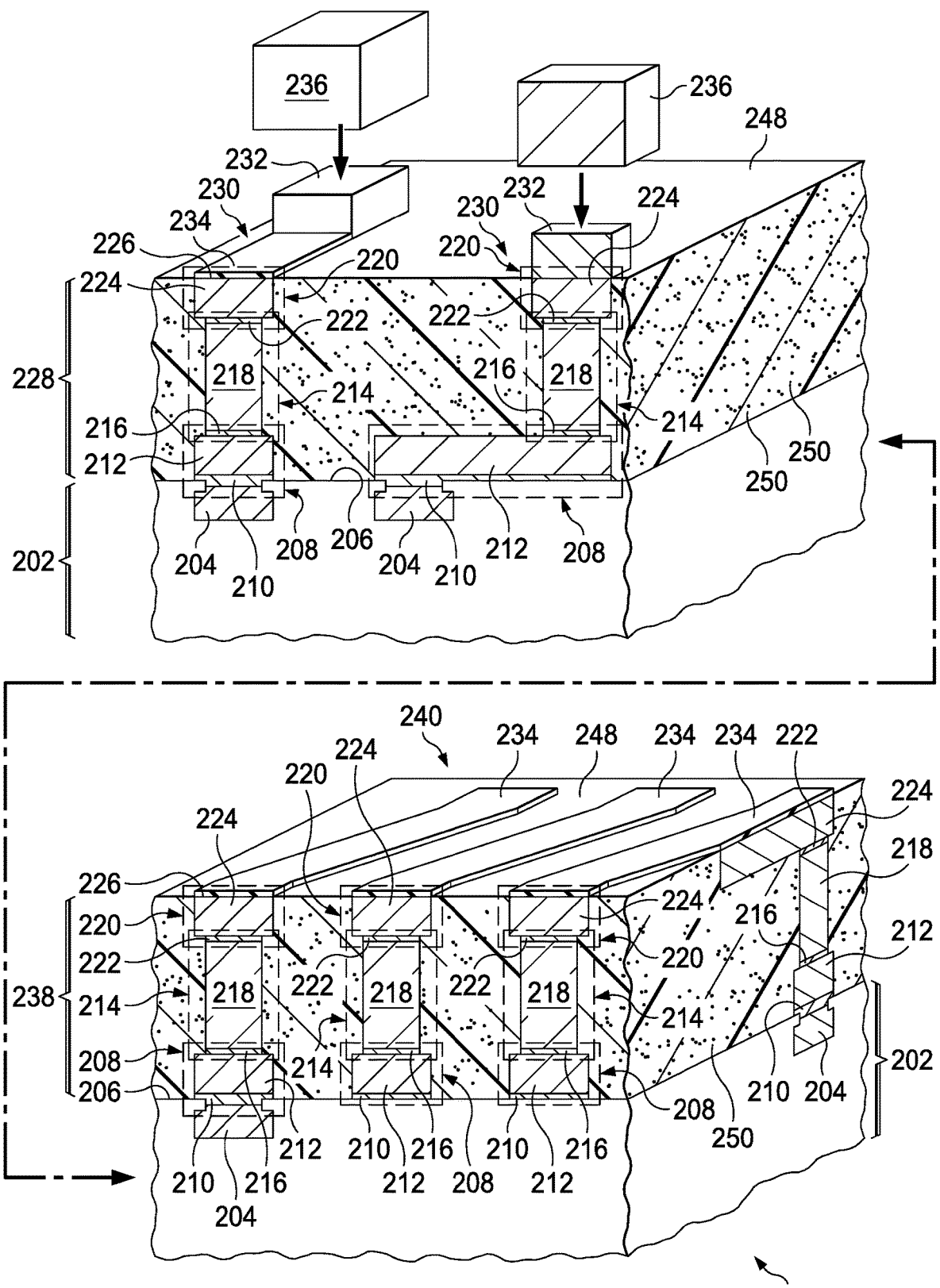

Referring to FIG. 2L, an insulating layer 234 may be formed on the second main conductors 224, to define areas for a subsequently-disposed die attach material 232, and to isolate the second main conductors 224 in the second set 238. The insulating layer 234 may include any of the materials disclosed in reference to the insulating layer 134 of FIG. 1. The insulating layer 234 may be formed by any of several methods. In one version of this example, the insulating layer 234 may be formed by spin coating the microelectronic device 200 with a photosensitive polymer material such as polyimide, and exposing the photosensitive polymer material to patterned ultraviolet (UV) light, then developing the photosensitive polymer material. In another version, the insulating layer 234 may be formed by a screen printing process. In a further version, the insulating layer 234 may be formed by an additive process, such as a material extrusion process. Other methods for forming the insulating layer 234 are within the scope of this example.

The die attach material 232 is formed on the die attach surfaces 226 of the bump bonds 230. The die attach material 232 may include solder, in the form of solder paste, formed by a screen print process or a material extrusion process. The die attach material 232 may include solder, in the form of a solder layer, formed using a melted solder bath. The die attach material 232 may include electrically conductive adhesive, formed by a screen print process or a material extrusion process. Other compositions for the die attach material 232 and methods for formation are within the scope of this example. The insulating layer 234 may be used to define areas for the die attach material 232.

The microelectronic device 200 is attached to external leads 236 by electrically coupling the bump bonds 230 to the external leads 236 through the die attach material 232. The external leads 236 may be part of a package, such as a lead frame or chip carrier, containing the microelectronic device 200. Alternatively, the external leads 236 may be part or a circuit substrate, such as a printed circuit board (PCB), on which the microelectronic device 200 is mounted. In versions of this example in which the die attach material 232 includes solder, the microelectronic device 200 may be attached to the external leads 236 by a solder reflow process. In versions of this example in which the die attach material 232 includes adhesive, the microelectronic device 200 may be attached to the external leads 236 by an adhesive curing process. The inductor 240, being formed of the first lateral conductors 208, the conductive columns 214, and the second lateral conductors 220, may advantageously be sufficiently robust to undergo the process of attaching the microelectronic device 200 to the external leads 236, without significant degradation.

Figure 3A:
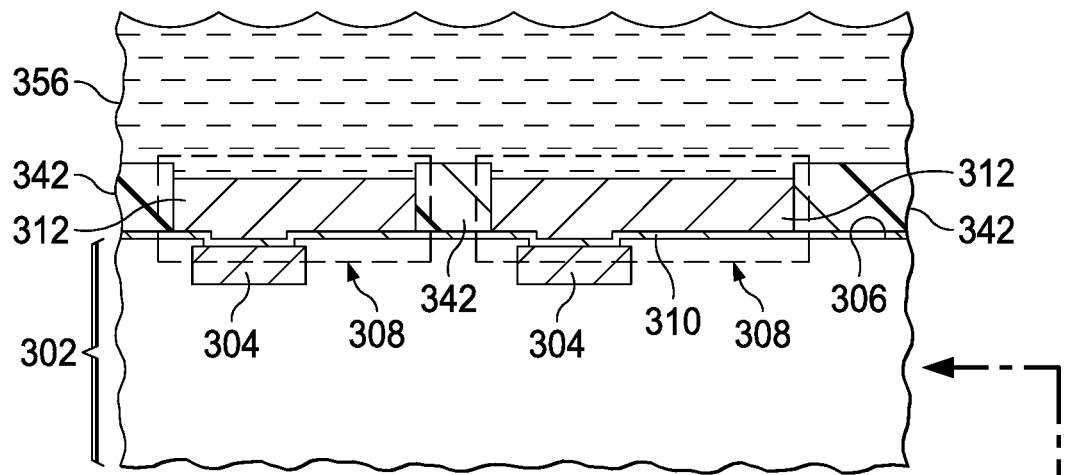
FIG. 3A through FIG. 3F are cross sections of a microelectronic device having a die, and bump bonds and an inductor on the die, depicted in stages of another example method of formation.
Figure 3A:
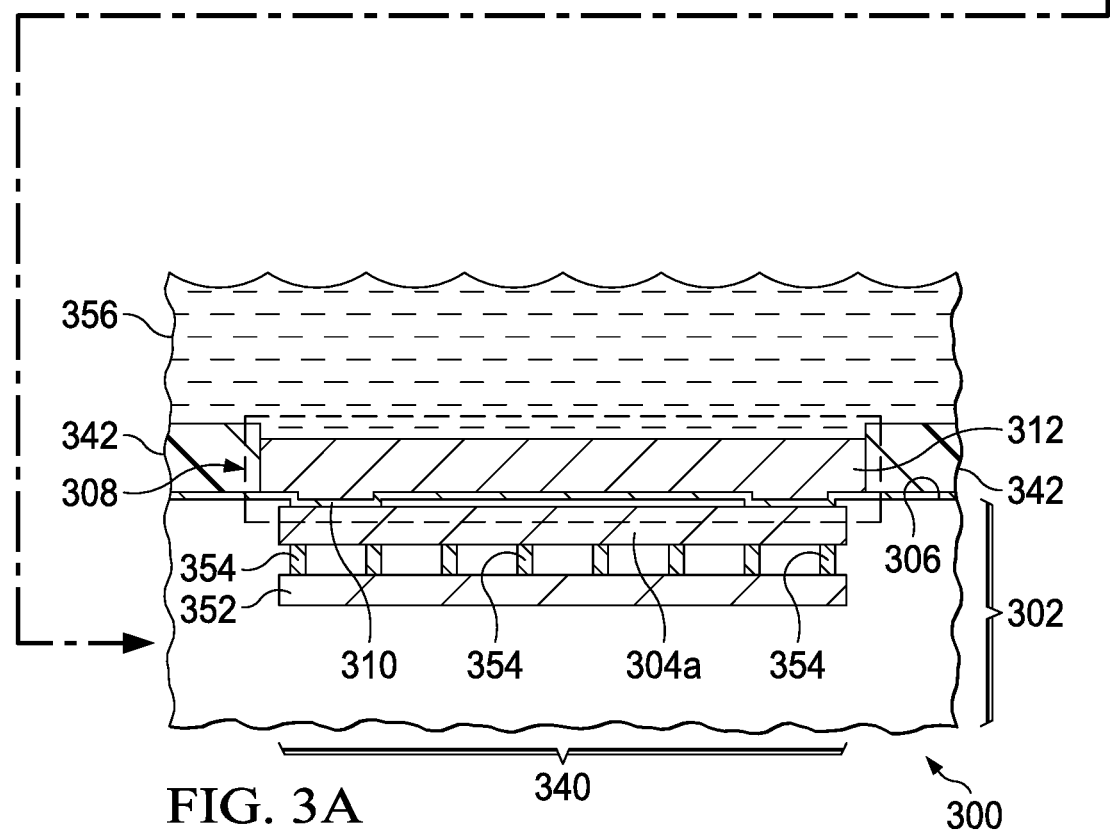

FIG. 3A through FIG. 3F are cross sections of a microelectronic device having a die, and bump bonds and an inductor on the die, depicted in stages of another example method of formation. Referring to FIG. 3A, the microelectronic device 300 includes the die 302, which may be implemented as a discrete semiconductor device, an integrated circuit, a MEMS device, or other such microelectronic die. The die 302 has terminals 304 of electrically conductive material, which extend to a terminal surface 306 of the die 302.

In this example, the terminals 304 may include one or more elongated terminals 304a, spanning a length for a lower winding in an area for the inductor 340. One or more interconnects 352 of the die 302 may also span the length for the lower winding, and may be electrically coupled to the elongated terminal 304a by vias 354 of the die 302. The interconnects 352 and the vias 354 may be parts of an interconnect network of the die 302.

A first conductor seed layer 310 is formed on the die 302, contacting the terminals 304. The first conductor seed layer 310 may have a layer structure and composition as disclosed in reference to the first conductor seed layer 210 of FIG. 2A, and may be formed as disclosed in reference to the first conductor seed layer 210.

A first conductor plating mask 342 is formed over the first conductor seed layer 310, exposing areas for first lateral conductors 308. The first conductor plating mask 342 may have a composition as disclosed in reference to the first conductor plating mask 242 of FIG. 2A, and may be formed as disclosed in reference to the first conductor plating mask 242.

First main conductors 312 are formed on the first conductor seed layer 310, where exposed by the first conductor plating mask 342, using a first copper plating bath 356. The first copper plating bath 356 may be implemented in an electroplating process, or in an electroless plating process. In this example, the first conductor plating mask 342 is left in place after the first main conductors 312 are formed. A portion of the first conductor seed layer 310 that is between the first main conductors 312 and the terminal surface 306, combined with the first main conductors 312, provide the first lateral conductors 308 of the microelectronic device 300.

Figure 3B:
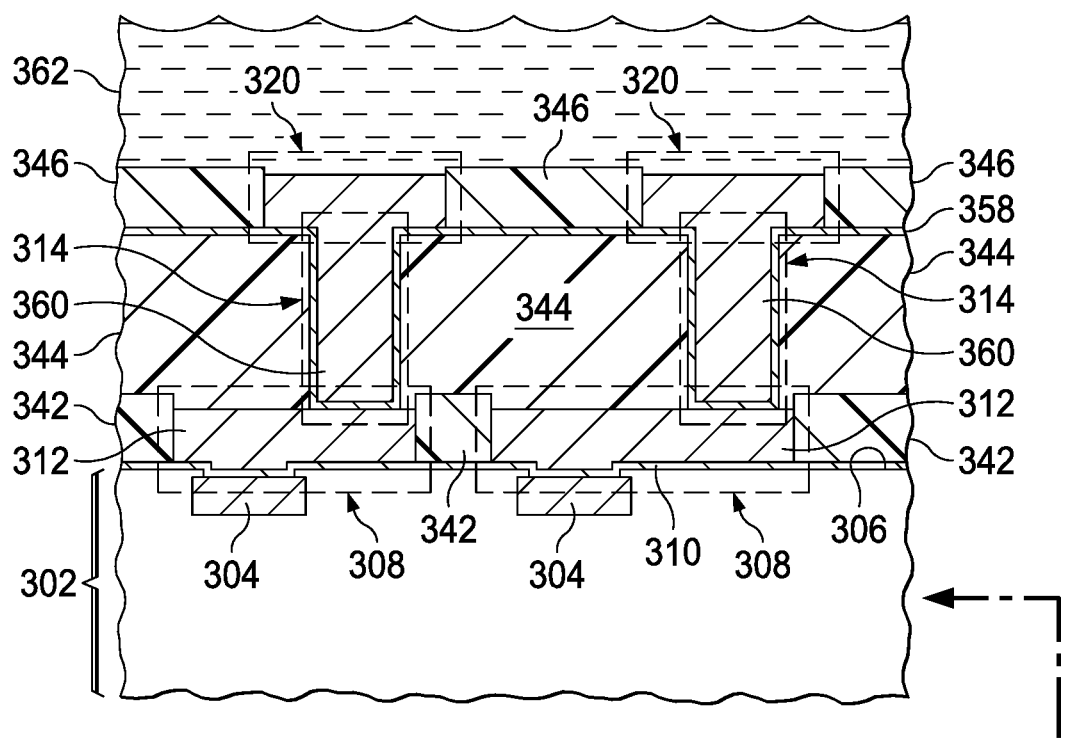
Figure 3B:
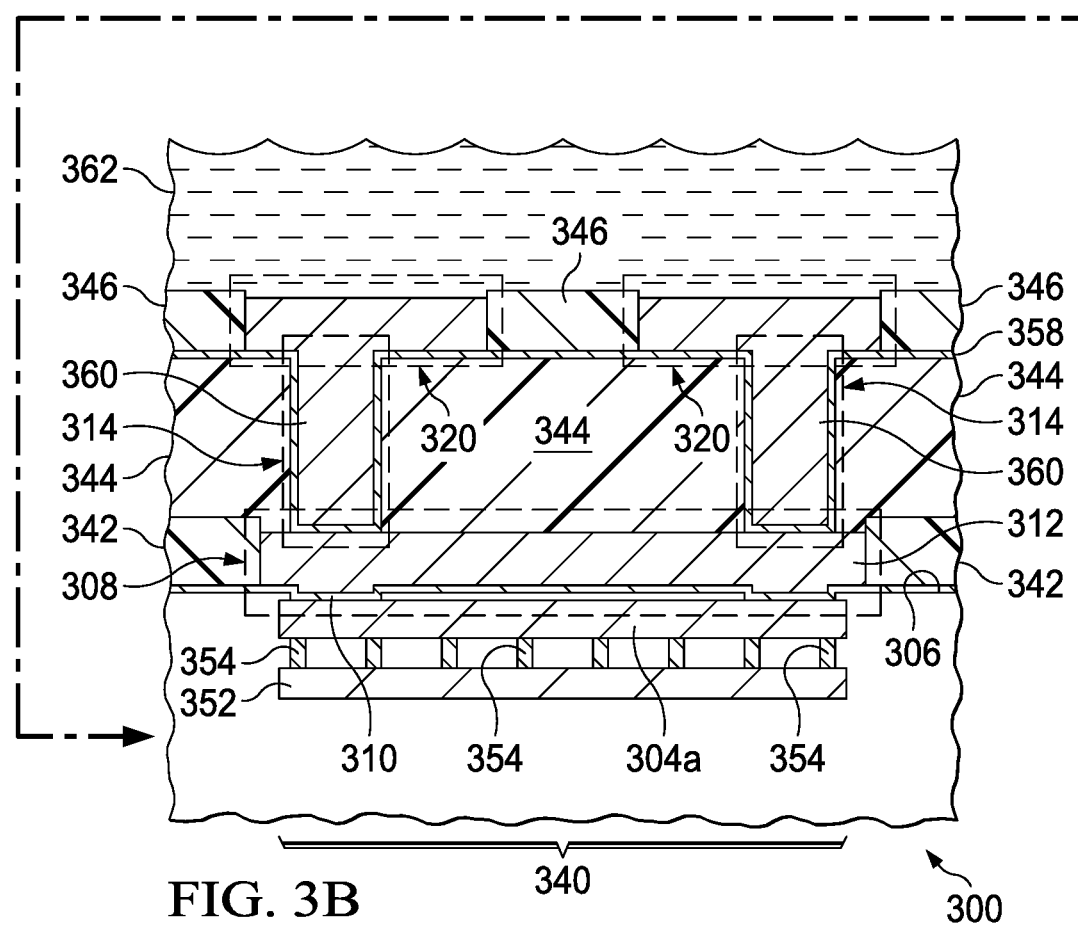

Referring to FIG. 3B, a column plating mask 344 is formed over the first conductor plating mask 342 and the first lateral conductors 308, exposing areas for conductive columns 314 on the first lateral conductors 308. The column plating mask 344 may have a composition as disclosed for the column plating mask 244 of FIG. 2D, and may be formed by any of the methods disclosed for the column plating mask 244.

A second conductor seed layer 358 is formed over the column plating mask 344, making contact with the first lateral conductors 308 where exposed by the column plating mask 344. The second conductor seed layer 358 may have a layer structure and composition as disclosed in reference to the column seed layer 216 of FIG. 2C or the second conductor seed layer 222 of FIG. 2F, and may be formed as disclosed in reference to the column seed layer 216 or the first conductor seed layer 210.

A second conductor plating mask 346 is formed over the second conductor seed layer 358, exposing areas for second lateral conductors 320. The second conductor plating mask 346 may have a composition as disclosed for the second conductor plating mask 246 of FIG. 2F, and may be formed by any of the methods disclosed for the second conductor plating mask 246.

Second main conductors 360 are formed on the second conductor seed layer 358, where exposed by the second conductor plating mask 346, using a second copper plating bath 362. The second copper plating bath 362 may be implemented in an electroplating process, or in an electroless plating process, and may be implemented using equipment and plating solutions of the first copper plating bath 356 of FIG. 3A. A portion of the second conductor seed layer 358 that is laterally surrounded by the column plating mask 344, combined with a portion of the second main conductors 360 that are laterally surrounded by the column plating mask 344, provide the conductive columns 314 of the microelectronic device 300. A portion of the second conductor seed layer 358 that is laterally surrounded by the second conductor plating mask 346, combined with a portion of the second main conductors 360 that are laterally surrounded by the second conductor plating mask 346, provide the second lateral conductors 320 of the microelectronic device 300. Providing the conductive columns 314 and the second lateral conductors 320 from portions of the second main conductors 360, which was formed using one plating bath, may advantageously reduce fabrication cost and complexity compared to forming the conductive columns 314 and the second lateral conductors 320 using separate plating baths.

Figure 3C:
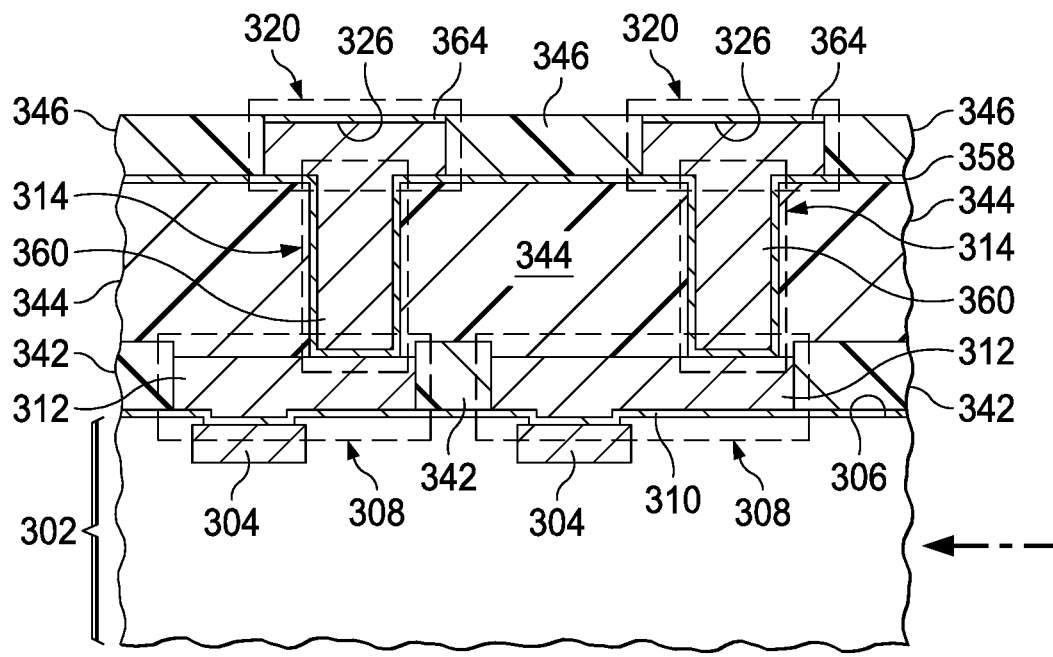
Figure 3C:
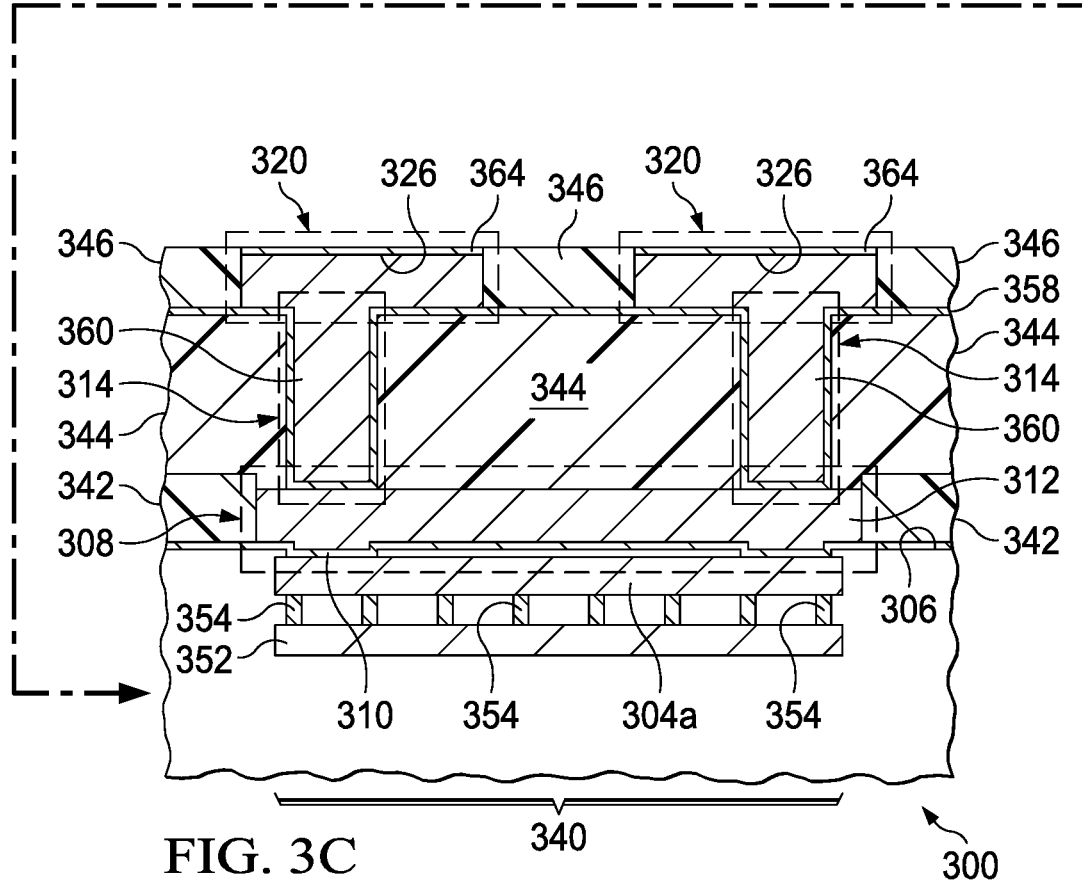

Referring to FIG. 3C, the second lateral conductors 320 have die attach surfaces 326 located opposite from the first lateral conductors 308. Barrier layers 364 may optionally be formed on the second lateral conductors 320, covering the die attach surfaces 326. The barrier layers 364 may include one or more metals which reduce diffusion of copper and tin to inhibit formation of copper-tin intermetallic compounds. The barrier layers 364 may include, for example, nickel, cobalt, or molybdenum. The barrier layers 364 may be particularly advantageous when solder containing tin, such as silver-tin solder, is disposed on the second lateral conductors 320. The barrier layers 364 may be formed by an electroplating process, such as a reverse pulse electroplating process, which may enable a desired ratio of the metals in the barrier layers 364 that would be difficult to attain using direct current (DC) plating.

The second conductor plating mask 346 is subsequently removed. The second conductor plating mask 346 may be removed by any of the methods disclosed for removing the second conductor plating mask 246 in reference to FIG. 2H.

The second conductor seed layer 358 is removed where exposed by the removal of the second conductor plating mask 346. The second conductor seed layer 358 may be removed by any of the methods disclosed for removing the second conductor seed layer 222 in reference to FIG. 2I.

The column plating mask 344 removed. The column plating mask 344 may be removed by any of the methods disclosed for removing the column plating mask 244 in reference to FIG. 2J.

The first conductor seed layer 310 is removed where exposed by the removal of the column plating mask 344. The first conductor seed layer 310 may be removed by any of the methods disclosed for removing the first conductor seed layer 210 in reference to FIG. 2J. Removal of the first conductor seed layer 310 may result in removal of portions of the second conductor seed layer 358 that are exposed by the removal of the column plating mask 344.

Figure 3D:
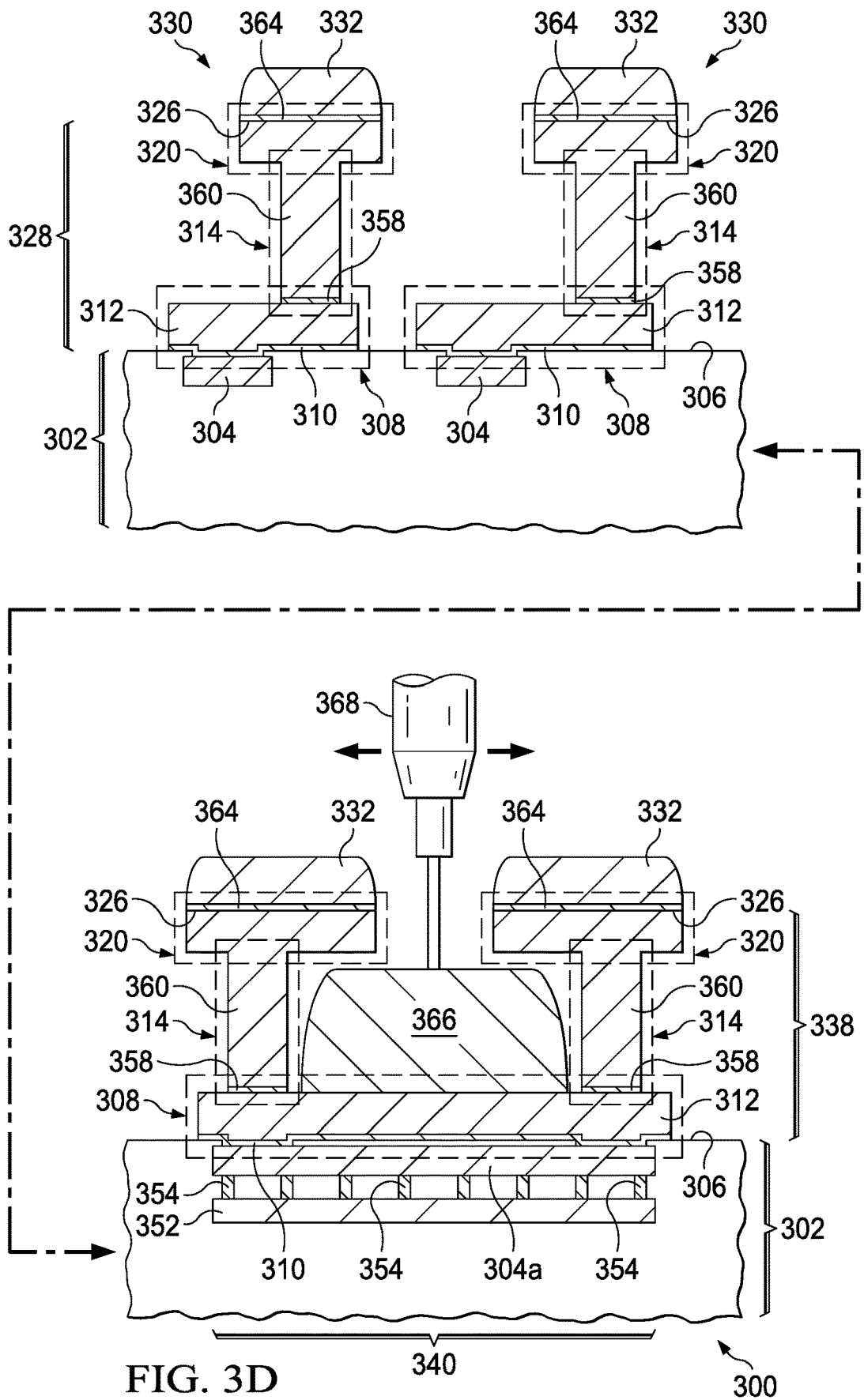

Referring to FIG. 3D, a first set 328 of the first lateral conductors 308, the conductive columns 314, and the second lateral conductors 320 provide the bump bonds 330 of the microelectronic device 300. A second set 338 of the first lateral conductors 308, the conductive columns 314, and the second lateral conductors 320 are electrically configured in series to provide the inductor 340. The elongated terminal 304a and the interconnect 352 are electrically coupled in parallel to the first lateral conductors 308 of the inductor 340, reducing an electrical resistance of the inductor 340 and thus advantageously increasing a Q factor of the inductor 340.

A die attach material 332 is formed over the die attach surfaces 326, on the barrier layers 364, if present. The die attach material 332 may have any of the compositions disclosed for the die attach material 232 of FIG. 2L. The die attach material 332 may be formed by any of the methods disclosed in reference to the die attach material 232.

A magnetic material 366 having a relative magnetic permeability greater than 1 may be formed between the conductive columns 314 of the inductor 340, which may advantageously increase an inductance of the inductor 340. The magnetic material 366 may include, for example, ferrite particles or ferromagnetic particles containing iron, nickel, or cobalt, in a polymer binder such as epoxy. The magnetic material 366 may be formed in the inductor 340 using an additive process, such as a material extrusion process 368 as depicted in FIG. 3D.

Figure 3E:
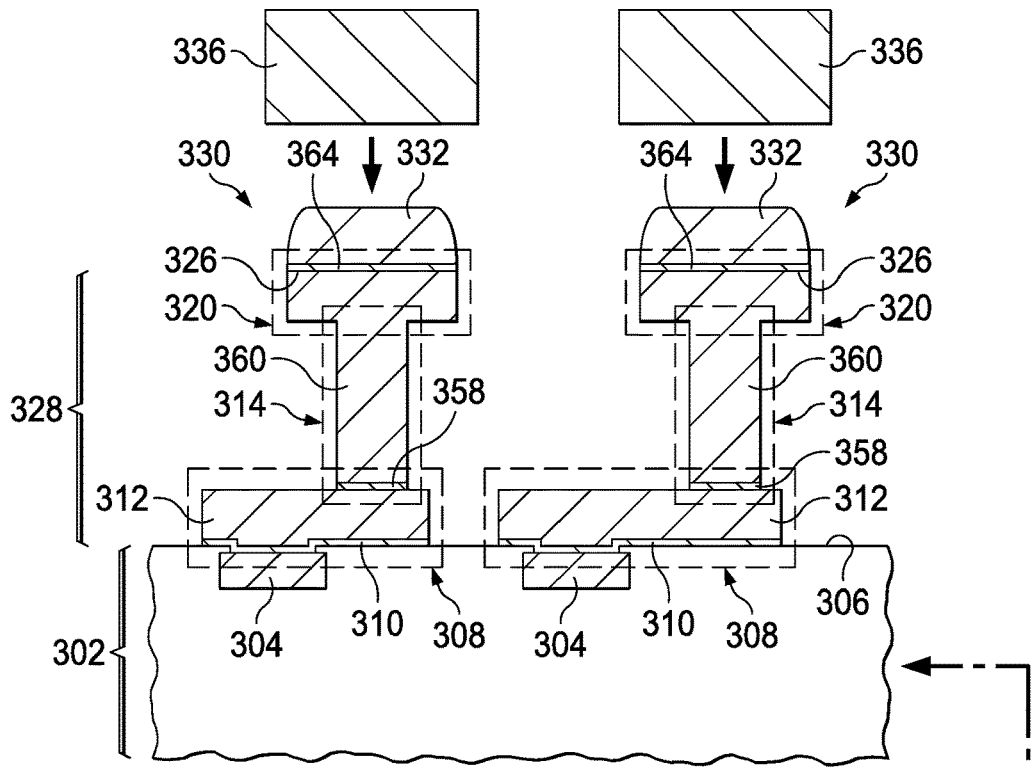
Figure 3E:
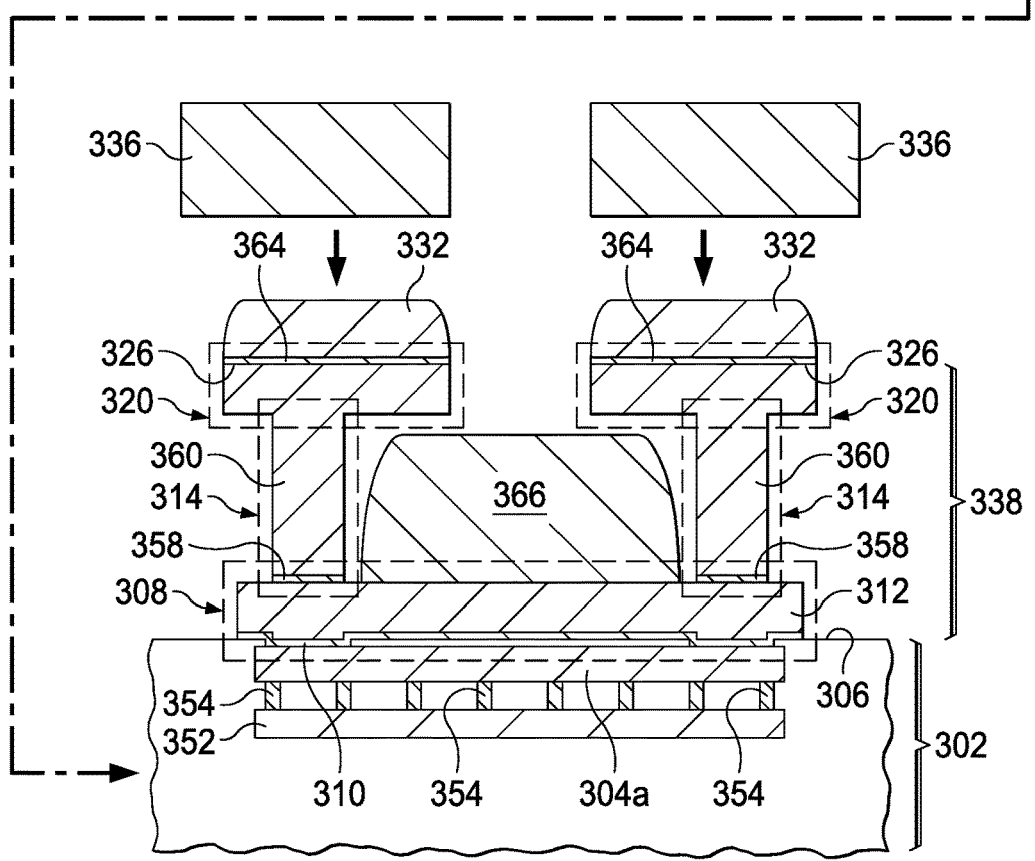

Referring to FIG. 3E, the microelectronic device 300 is attached to external leads 336 by electrically coupling the bump bonds 330 and the inductor 340 to the external leads 336 through the die attach material 332. The external leads 336 may be part of a package containing the microelectronic device 300, or may be part or a circuit substrate on which the microelectronic device 300 is mounted. The microelectronic device 300 may be attached to the external leads 336 as described in reference to FIG. 2L. In this example, the external leads 336 that are electrically coupled to the inductor 340 may further reduce the electrical resistance of the inductor 340 and thus advantageously increase the Q factor of the inductor 340. The inductor 340 and the bump bonds 330, being formed of the first lateral conductors 308, the conductive columns 314, and the second lateral conductors 320, may advantageously be sufficiently robust to undergo the process of attaching the microelectronic device 300 to the external leads 336, without loss of mechanical integrity, even though the inductor 340 and the bump bonds 330 are not mechanically supported by encapsulation material.

Figure 3F:
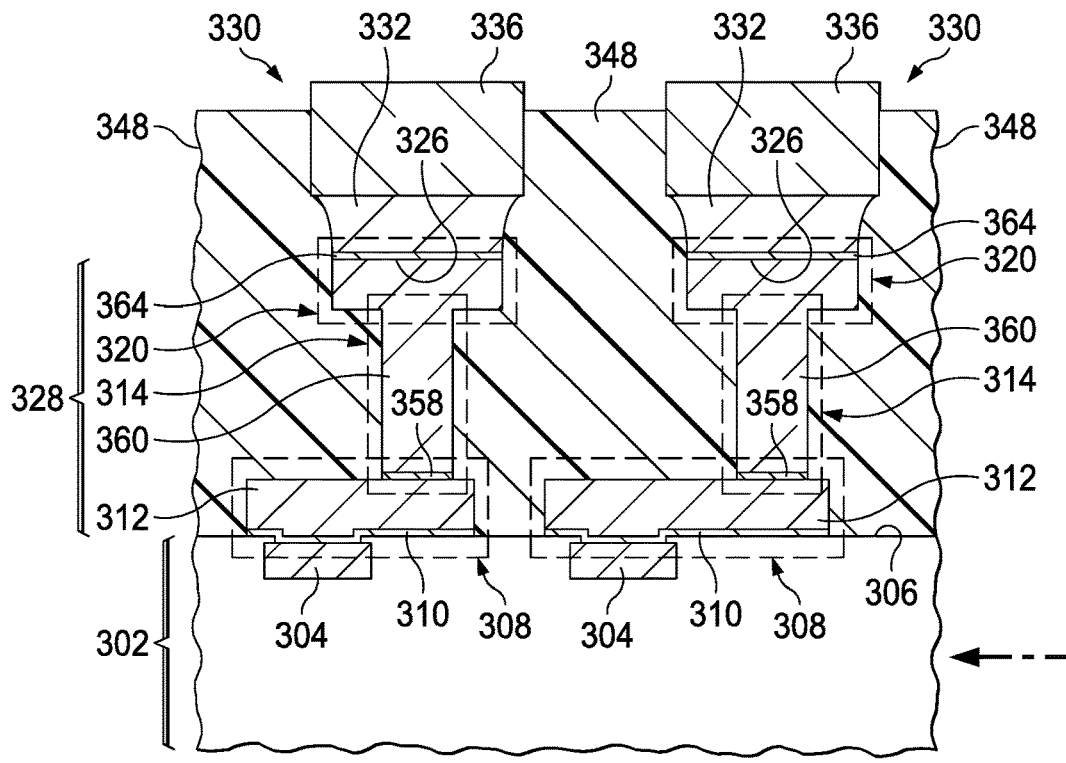
Figure 3F:
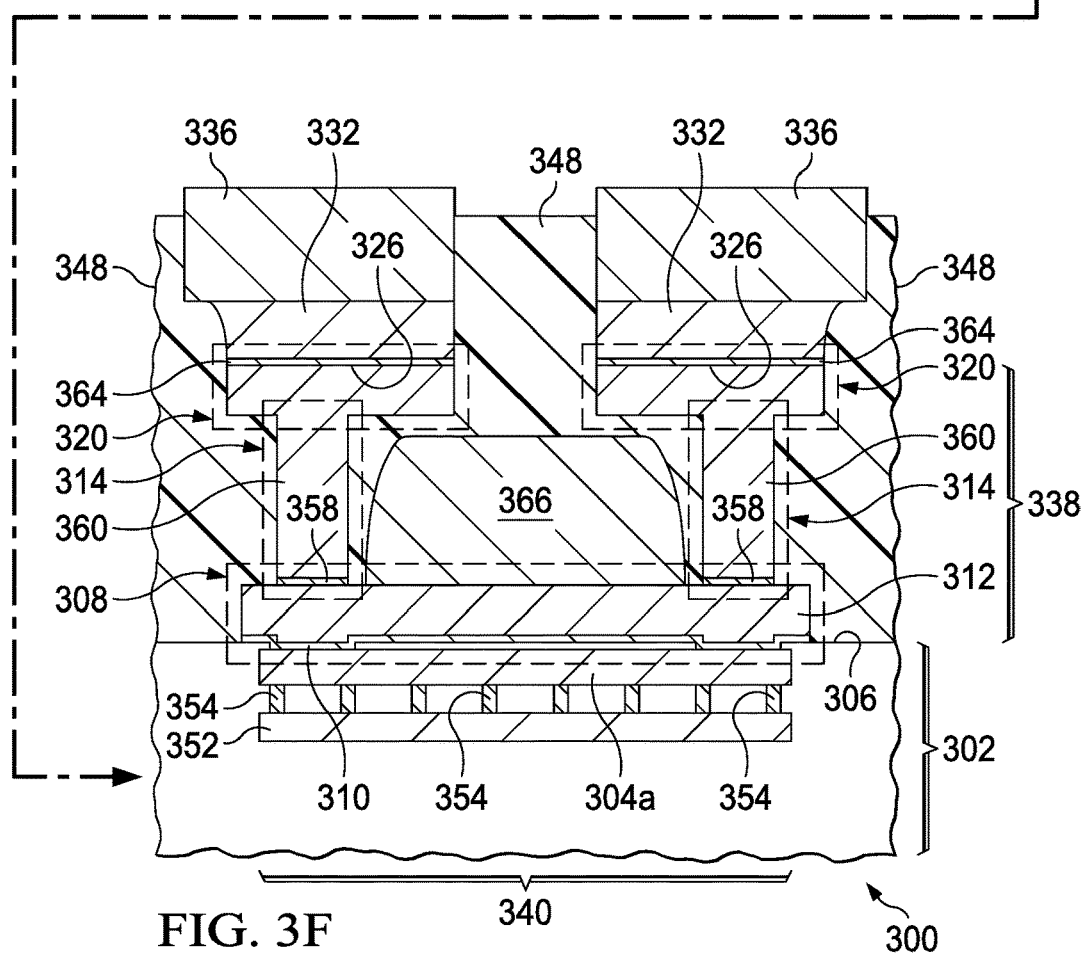

Referring to FIG. 3F, encapsulation material 348, which may be referred to as an underfill material, may be formed on the die 302, surrounding the first lateral conductors 308, the conductive columns 314, the second lateral conductors 320, and the die attach material 332, and extending to the external leads 336. The encapsulation material 348 may include epoxy, and may be formed by injection molding. The encapsulation material 348 may provide mechanical support for the first lateral conductors 308, the conductive columns 314, and the second lateral conductors 320.

Figure 4:
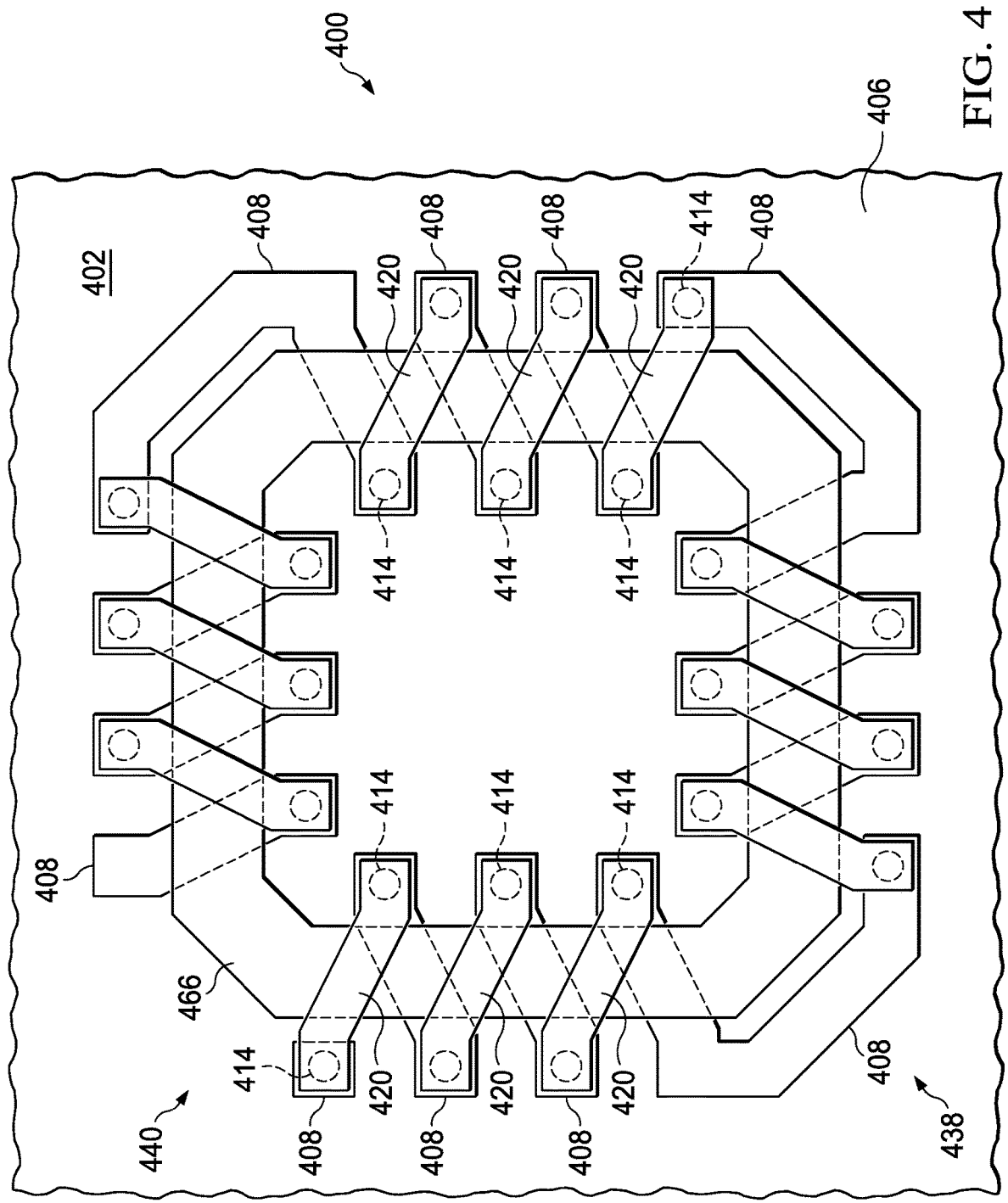
FIG. 4 is a top view of an example microelectronic device having a die, and an inductor on the die.

FIG. 4 is a top view of an example microelectronic device having a die, and an inductor on the die. The microelectronic device 400 includes the die 402, and the die 402 has a terminal surface 406. The microelectronic device 400 includes first lateral conductors 408, conductive columns 414, and second lateral conductors 420 on the terminal surface 406. A first set, not shown in FIG. 4, of the first lateral conductors 408, the conductive columns 414, and the second lateral conductors 420 provide bump bonds, not shown in FIG. 4, of the microelectronic device 400. A second set 438 of the first lateral conductors 408, the conductive columns 414, and the second lateral conductors 420 are electrically configured in series to provide the inductor 440. In this example, the inductor 440 has a toroidal configuration, that is, the first lateral conductors 408, the conductive columns 414, and the second lateral conductors 420 of the inductor 440 are arranged on a closed loop array. A magnetic material 466 having a relative magnetic permeability greater than 1 may be located in the inductor 440, over the first lateral conductors 408 and under the second lateral conductors 420. The toroidal configuration may provide a desired inductance for the inductor 440 in a compact space on the terminal surface 406. One or more nodes of the inductor 440 may be electrically coupled to components in the die 402, or to external leads, not shown in FIG. 4.

Figure 5:
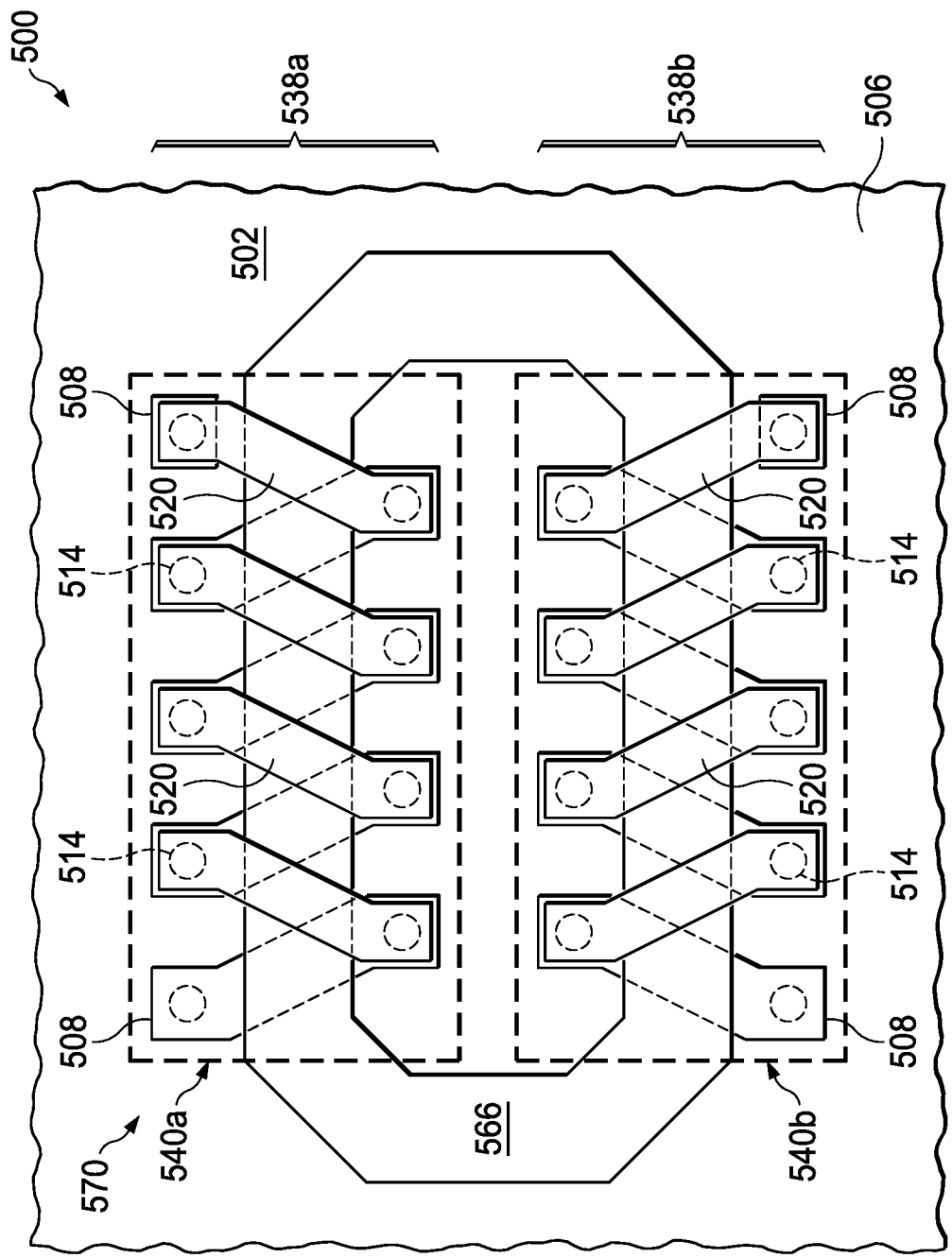
FIG. 5 is a top view of another example microelectronic device having a die, and a transformer including two inductors on the die.

FIG. 5 is a top view of another example microelectronic device having a die, and a transformer including two inductors on the die. The microelectronic device 500 includes the die 502, and the die 502 has a terminal surface 506. The microelectronic device 500 includes first lateral conductors 508, conductive columns 514, and second lateral conductors 520 on the terminal surface 506. A first set, not shown in FIG. 5, of the first lateral conductors 508, the conductive columns 514, and the second lateral conductors 520 provides bump bonds, not shown in FIG. 5, of the microelectronic device 500. A first second set 538a of the first lateral conductors 508, the conductive columns 514, and the second lateral conductors 520 are electrically configured in series to provide a first inductor 540a. A second second set 538b of the first lateral conductors 508, the conductive columns 514, and the second lateral conductors 520 are electrically configured in series to provide a second inductor 540b. A magnetic material 566 having a relative magnetic permeability greater than 1 is located in the first inductor 540a and in the second inductor 540b, over the first lateral conductors 508 and under the second lateral conductors 520. In this example, the first inductor 540a has a linear configuration, that is, the first lateral conductors 508, the conductive columns 514, and the second lateral conductors 520 are arranged on a surface of a cylinder around the magnetic material 566. Similarly, the second inductor 540b has a linear configuration around the magnetic material 566. The first inductor 540a and the second inductor 540b are elements of the transformer 570. FIG. 5 depicts the first inductor 540a and the second inductor 540b with equal numbers of windings around the magnetic material 566, however, other configurations of the transformer 570 having unequal numbers of windings are within the scope of this example. The transformer 570 may enable transmission of signals or power between the first inductor 540a and the second inductor 540b, advantageously without consuming space in the die 502.

Figure 6:
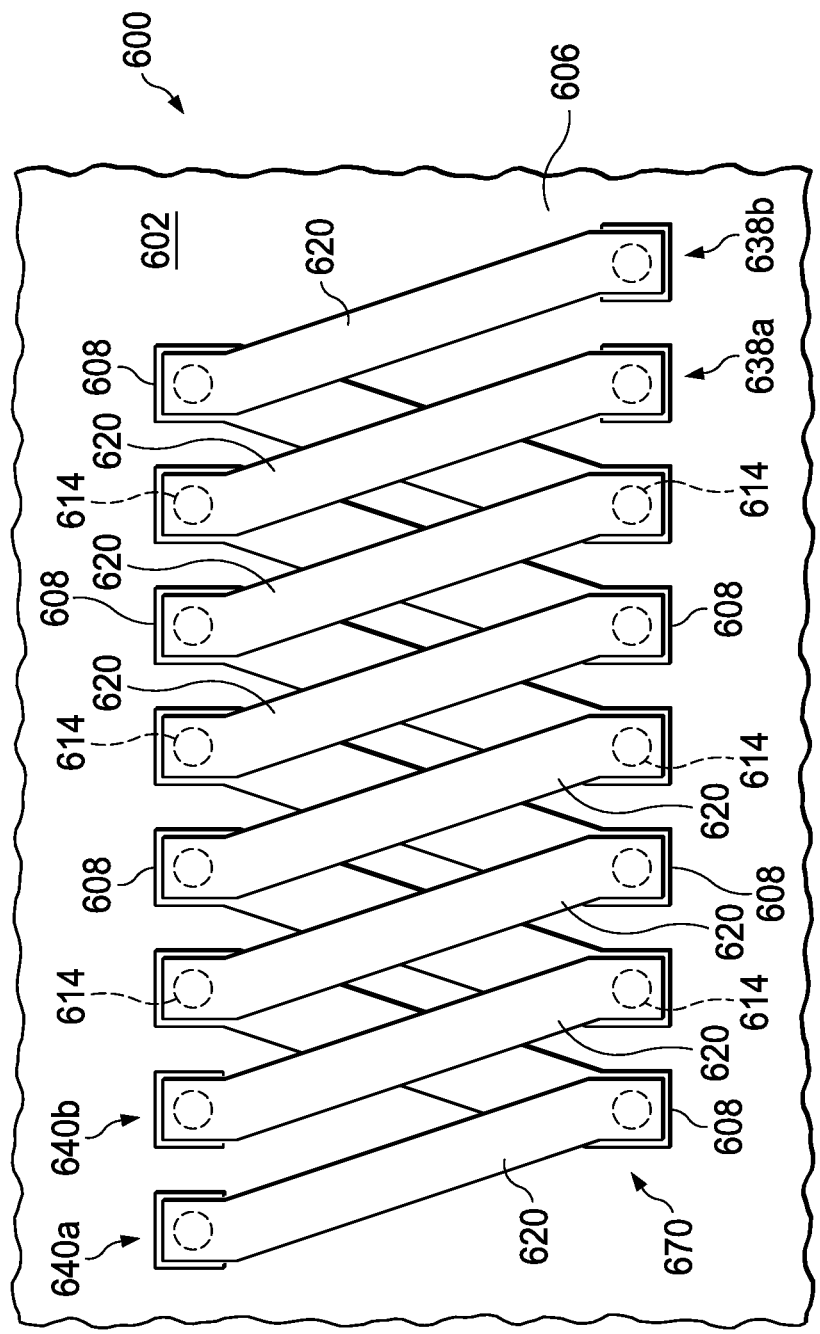
FIG. 6 is a top view of another example microelectronic device having a die, and a transformer including two inductors on the die.

FIG. 6 is a top view of another example microelectronic device having a die, and a transformer including two inductors on the die. The microelectronic device 600 includes the die 602, and the die 602 has a terminal surface 606. The microelectronic device 600 includes first lateral conductors 608, conductive columns 614, and second lateral conductors 620 on the terminal surface 606. A first set, not shown in FIG. 6, of the first lateral conductors 608, the conductive columns 614, and the second lateral conductors 620 provides bump bonds, not shown in FIG. 6, of the microelectronic device 600. A first second set 638a of the first lateral conductors 608, the conductive columns 614, and the second lateral conductors 620 are electrically configured in series to provide a first inductor 640a. A second second set 638b of the first lateral conductors 608, the conductive columns 614, and the second lateral conductors 620 are electrically configured in series to provide a second inductor 640b. In this example, the first inductor 640a and the second inductor 640b have linear configurations, and are interdigitated to form the transformer 670. The interdigitated configuration of the transformer 670 may enable transmission of signals or power between the first inductor 640a and the second inductor 640b, without magnetic material disposed in the first inductor 640a or the second inductor 640b.

Various features of the examples disclosed herein may be combined in other manifestations of example microelectronic devices. For example, the microelectronic device 100 of FIG. 1 may be formed by steps disclosed in reference to the method of FIG. 2A through FIG. 2L, by steps disclosed in reference to the method of FIG. 3A through FIG. 3F, or by another method. The microelectronic devices disclosed herein may be formed using any method, such as the methods described in the commonly assigned patent application having patent application Ser. No. 16/030,371, filed Jul. 9, 2018 which is incorporated herein by reference but is not admitted to be prior art with respect to the present invention by its mention in this section. The bump bonds 130 of FIG. 1 may have the barrier layers 364 of FIG. 3C. The microelectronic device 100 of FIG. 1 may include the encapsulation material 248 with the magnetic particles 250, as disclosed in reference to FIG. 2K, or may include the magnetic material 366, as disclosed in reference to FIG. 3D.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
   a die having a surface and including first and second bond pads on the surface;
   a first metal column on the first bond pad, the first metal column electrically coupled to the first bond pad;
   a first metal strip on the surface, in which the first metal strip has a first pair of bent segments and a first straight segment coupled between the first pair of bent segments;
   second and third metal columns on the first pair of bent segments;
   a second metal strip having a second pair of bent segments and a second straight segment coupled between the second pair of bent segments, in which the second pair of bent segments are on the first and second metal columns, and the first and second metal columns support the second metal strip over the surface;
   a fourth metal column on the second bond pad, the fourth metal column electrically coupled to the second bond pad; and
   a third metal strip having a third pair of bent segments and a third straight segment coupled between the third pair of bent segments, in which the third pair of bent segments are on the third and fourth metal columns, and the third and fourth metal columns support the third metal strip over the surface.

2. The microelectronic device of claim 1, wherein the first metal strip includes copper.

3. The microelectronic device of claim 2, further comprising:
   a seed layer coupled between the first metal strip and the surface, the seed layer including at least one of: titanium, tungsten, chromium, or nickel.

4. The microelectronic device of claim 1, wherein a thickness of the first metal strip is between 3 microns and 30 microns.

5. The microelectronic device of claim 1, wherein each of the first through third metal columns includes copper;
   wherein a respective width of each of the first through third metal columns is between 25 microns and 50 microns;
   wherein a respective length of each of the first through third metal columns is between 25 microns and 300 microns; and
   wherein a respective height of each of the first through third metal columns is between 30 microns and 100 microns.

6. The microelectronic device of claim 1, further comprising:
   a first seed layer coupled between the first metal strip and the second metal column;
   a second seed layer coupled between the first metal strip and the third metal column;
   a third seed layer coupled between the second metal strip and the first metal column;
   a fourth seed layer coupled between the second metal strip and the second metal column;
   a fifth seed layer coupled between the third metal strip and the third metal column; and
   a sixth seed layer coupled between the third metal strip and the fourth metal column,
   wherein each of the first through sixth seed layers includes at least one of: titanium, chromium, or nickel.

7. The microelectronic device of claim 1, wherein the second and third metal strips conductors include copper.

8. The microelectronic device of claim 1, wherein a respective thickness of each of the second and third metal strips is between 3 microns to 30 microns.

9. The microelectronic device of claim 1, further comprising a first layer of die attach material on the second metal strip and a second layer of die attach material on the third metal strip, the die attach material including at least one of: a solder, or an adhesive.

10. The microelectronic device of claim 1, further comprising a magnetic material that surrounds at least parts of the first through third metal strips and at least parts of the first through fourth metal columns.

11. The microelectronic device of claim 10, wherein the magnetic material includes magnetic particles, and a molding compound in which the magnetic particles are suspended.

12. The microelectronic device of claim 10, wherein the first through fourth metal columns and the first through third metal strips are part of an inductor electrically coupled between the first and second bond pads, in which the inductor has a linear configuration.

13. The microelectronic device of claim 10, further comprising a fourth metal strip on the surface, the fourth metal strip coupled between the first and second bond pads; and
   wherein the first through fourth metal columns and the first through fourth metal strips are part of an inductor having a toroidal configuration.

14. The microelectronic device of claim 1, wherein the die has a third bond pad on the surface, and the microelectronic device further comprises:
   a fifth metal column on the third bond pad;
   a fourth metal strip having opposite first and second ends, in which the first end is coupled to the fifth metal column, and the fourth metal strip is supported on the fifth metal column over the surface; and
   a layer of die attach material on the second end of the fourth metal strip.

15. The microelectronic device of claim 1, wherein the die has a third bond pad on the surface, and the microelectronic device further comprises:
   a fourth metal strip having opposite first and second ends, in which the first end is on the third bond pad;
   a fifth metal column on the second end of the fourth metal strip; and
   a layer of die attach material on the fifth metal column, in which the fifth metal column is coupled between the layer of die attach material and the fourth metal strip.

16. The microelectronic device of claim 1, wherein the first straight segment is angled from the second straight segment, and the second straight segment is angled from the third straight segment.

17. A microelectronic device, comprising:
   a die having a surface and including a bond pad on the surface; and
   an inductor electrically connected to the die, in which the inductor includes:
      a first metal pillar on the bond pad, the first metal pillar electrically coupled to the bond pad;
      a first metal strip on the surface, in which the first metal strip has a first pair of bent segments and a first straight segment coupled between the first pair of bent segments;
      a second metal pillar on one of the first pair of bent segments of the first metal strip; and
      a second metal strip having a second pair of bent segments and a second straight segment coupled between the second pair of bent segments, in which the second pair of bent segments are on the first and second metal pillars, and the first and second metal pillars support the second metal strip over the surface.

18. The microelectronic device of claim 17, further comprising a magnetic material surrounding at least a part of the inductor.

19. The microelectronic device of claim 18, wherein the magnetic material includes magnetic particles, and a molding compound in which the magnetic particles are suspended.

20. The microelectronic device of claim 17, wherein the first and second metal strips include copper.

21. The microelectronic device of claim 17, further comprising a seed layer coupled between the first metal strip and the surface, the seed layer including at least one of: titanium, tungsten, chromium, or nickel.

22. The microelectronic device of claim 17, wherein the bond pad is a first bond pad, and the die includes a second bond pad on the surface;
   wherein the inductor further includes:
      a third metal pillar on the first metal strip;
      a fourth metal pillar on the second bond pad, the fourth metal pillar being electrically coupled to the second bond pad; and
      a third metal strip having a third pair of bent segments and a third straight segment coupled between the third pair of bent segments, in which the third pair of bent segments are on the third and fourth metal pillars, and the third and fourth metal pillars support the third metal strip over the surface.

* * * * *